(12) United States Patent
Nakanishi

(10) Patent No.: US 6,411,640 B1
(45) Date of Patent: Jun. 25, 2002

(54) DISTRIBUTED FEEDBACK SEMICONDUCTOR LASER WITH PHASE SHIFT REGION HAVING POLARIZATION DEPENDENCY, OPTICAL TRANSMITTER, AND OPTICAL COMMUNICATION SYSTEM USING THE SAME

(75) Inventor: Koichiro Nakanishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/292,018

(22) Filed: Apr. 15, 1999

(30) Foreign Application Priority Data

Apr. 27, 1998 (JP) ............................................ 10-132770

(51) Int. Cl.$^7$ ................................................ H01S 5/12
(52) U.S. Cl. ............................................ 372/96; 372/97
(58) Field of Search ........................................ 372/96, 27

(56) References Cited

U.S. PATENT DOCUMENTS 4,796,273 A * 1/1989 Yamaguchi .................. 372/96
5,878,066 A * 3/1999 Mizutani et al. ............... 372/27

FOREIGN PATENT DOCUMENTS

JP 2-159781 6/1990

OTHER PUBLICATIONS

Jeff Hecht, Understanding Fiber Optics (1999), Prentice Hall, p. 33.*

* cited by examiner

Primary Examiner—Paul Ip
Assistant Examiner—Jeffrey N Zahn
(74) Attorney, Agent, or Firm—Fitzpatrick, Cella, Harper & Scinto

(57) ABSTRACT

A distributed feedback semiconductor laser of the present invention includes a waveguide with an active layer and a diffraction grating, and a first phase shift region formed in the waveguide. The waveguide extends along a cavity-axial direction and is defined such that propagation of light in two different polarization modes is permitted in the waveguide. The first phase shift region extends along the cavity-axial direction and has a polarization dependency that an effective refractive index for propagation light of the first phase shift region differs from an effective refractive index for propagation light of a region of the waveguide other than the first phase shift region such that a phase shift of a quarter wavelength of the propagation light is created for one of the two polarization modes and a phase shift of a half wavelength of the propagation light is created for the other of the two polarization modes in the first phase shift region.

25 Claims, 15 Drawing Sheets

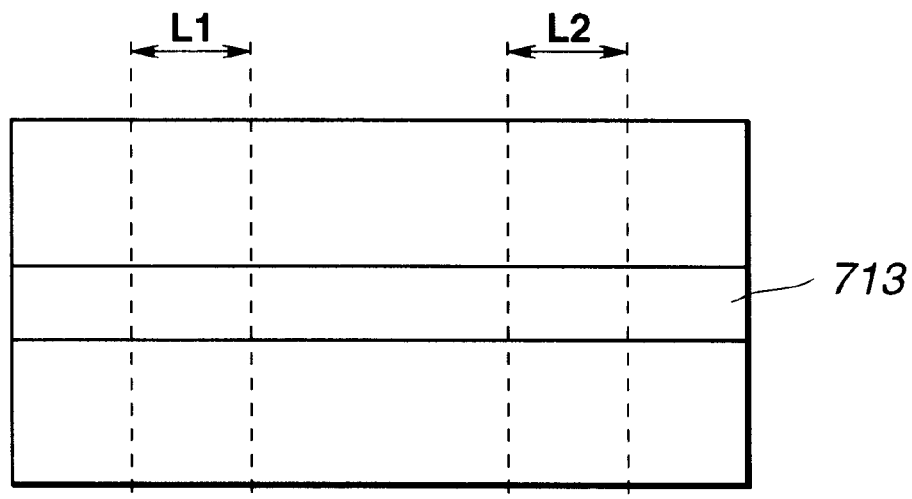
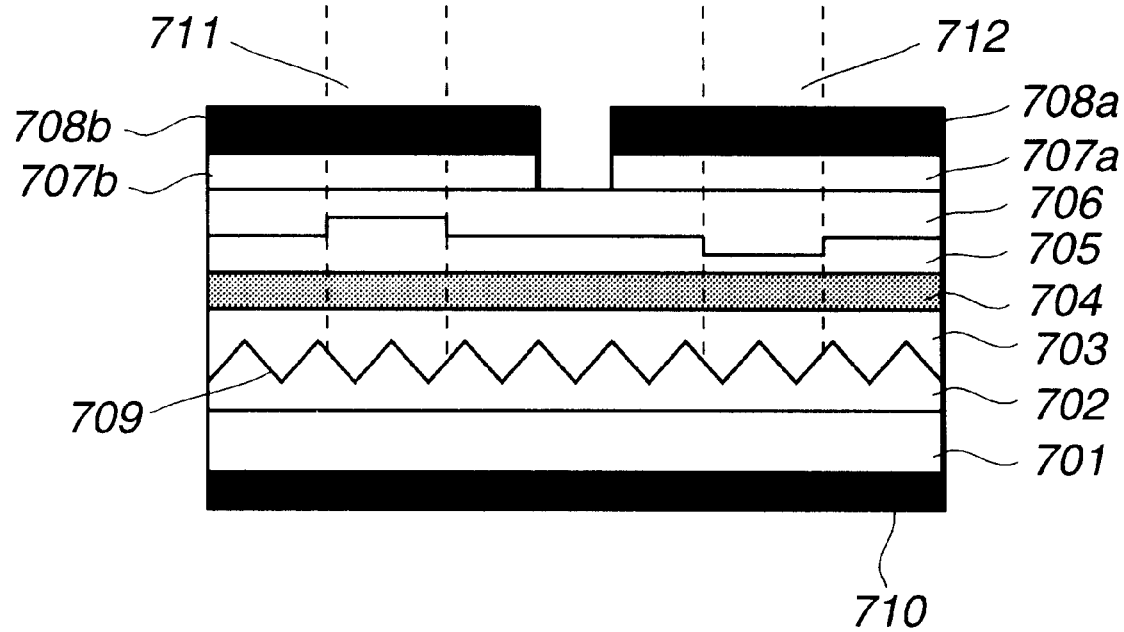

DISTRIBUTED FEEDBACK SEMICONDUCTOR LASER WITH PHASE SHIFT REGION HAVING POLARIZATION DEPENDENCY, OPTICAL TRANSMITTER, AND OPTICAL COMMUNICATION SYSTEM USING THE SAME

BACKGROUND OF THE INVENTION

1. Field of the Invention

The present invention relates to a semiconductor laser device with a phase shift region having a polarization dependency suitably usable as a light source for optical communications or the like, such as a distributed feedback (DFB) semiconductor laser capable of switching a polarization mode of its output light between two polarization modes (typically, transverse electric (TE) mode and transverse magnetic (TM) mode) depending on its driven condition. The present invention also relates to an apparatus or system using the laser device.

2. Related Background Art

In recent years, optical communication and optical information processing have been earnestly studied to cope with a rapid increase in information handling capacity due to development of multimedia and the like. A dynamic-single-mode device with a narrow spectrum has been needed to serve as a light source for those optical communications and for information processing. For such purposes, DFB semiconductor lasers and distributed Bragg reflector (DBR) semiconductor lasers have been developed and studied. Japanese Patent Application Laid-Open No. 2(1990)-159781 (JP '781), for example, discloses a polarization switchable laser which can emit an intensity-modulated signal with a high extinction ratio and can serve the purposes described above. In this device, a pumped condition in its portion is changed to perform the switching of its oscillation polarization mode.

FIG. 1 illustrates the polarization switchable device. FIG. 1 is a cross-sectional view taken along a laser resonance (cavity-axial) direction of the device. The structure includes a light guide layer 1102, an active layer 1103, a clad layer 1104, and a contact layer 1105 which are laid down over a substrate 1101 of InP. A uniform diffraction grating 1108 is formed at the interface between the light guide layer 1102 and the substrate 1101. The contact layer 1105 is divided into three portions along the cavity-axial direction. Bias electrodes 1106a and 1106b and a control electrode 1107 are respectively deposited on the three portions of the contact layer 1105. The control electrode 1107 is formed on a region for shifting the phase of an equivalent refractive index. A common electrode 1109 is formed on the bottom surface of the substrate 1101. The control electrode 1107 and the bias electrodes 1106a and 1106b are electrically separated from each other, so a current can be independently injected through the control electrode 1107. In the device of FIG. 1, the current injected into the phase shift region through the control electrode 1107 is changed or modulated under a condition under which appropriate bias currents are injected through the bias electrodes 1106a and 1106b. Thus, the equivalent refractive index is partly changed, and the shift amount of the equivalent refractive index is controlled for each of the two different polarization modes. Consequently, the relation between threshold gains for the two modes is changed and polarization switching is performed.

In the above proposal, the polarization modulation system itself is an advantageous one. However, in an ordinary DFB laser, oscillation in the TE mode is dominant over that in the TM mode, so polarization mode contention is difficult. JP '781 discloses no specific solution for this problem.

Further, in a DFB laser lacking built-in phase shift section, oscillation occurs at wavelengths at either or both ends of its stop band rather than at its Bragg wavelength in a single mode, due to adverse influences of fine unevenness in the diffraction grating and the phase at the end facet. In the above proposal, although the pumping condition is partially varied to introduce the phase shift, such phase shift due to the control of current injection is unstable and it is hence hard to achieve stable single-mode oscillation. Furthermore, the current for attaining the single-mode oscillation and the current for achieving the polarization switching vary among individual devices due to influences of the end-facet phase and so forth.

SUMMARY OF THE INVENTION

It is an object of the present invention to provide a semiconductor laser, such as a polarization switchable distributed feedback semiconductor laser, which includes a phase shift region with a polarization dependency such that light in a polarization mode influenced by a $\lambda/4$ phase shift can be stably oscillated in a single longitudinal mode, an optical transmitter with the laser, and an optical transmission system or method using the laser.

It is a second object of the present invention to provide a semiconductor laser, such as a polarization switchable distributed feedback semiconductor laser, which can suppress unfavorable phenomenon, such as hole burning due to extreme concentration of light on a part and can be fabricated by a simple process without needing a complicated process required for the fabrication of a conventional $\lambda/4$ phase shift diffraction grating.

It is a third object of the present invention to provide a semiconductor laser, such as a polarization switchable distributed feedback semiconductor laser, which can effect stable polarization-mode contention and effect a single-mode oscillation in each of the TE mode and the TM mode.

The objects of the present invention are achieved by the following lasers, transmitters and optical communication systems or methods.

A distributed feedback semiconductor laser of the present invention includes a waveguide with an active layer and a diffraction grating, which extends along a cavity-axial direction and is defined such that propagation of light in two different polarization modes is permitted in the waveguide; and a first phase shift region formed in the waveguide. The first phase shift region extends along the cavity-axial direction and has a polarization dependency that an effective refractive index for propagation light of the first phase shift region differs from an effective refractive index for propagation light of a region of the waveguide other than the first phase shift region such that a phase shift of a quarter wavelength of the propagation light is created for one of the two polarization modes and a phase shift of a half wavelength of the propagation light is created for the other of the two polarization modes in the first phase shift region.

The laser of the present invention can be typically constructed to act as a DFB semiconductor laser which can switch or modulate its oscillation polarization mode (in this specification, "switch", "switchable" and the like are used in a broad sense including a modulation wherein the polarization mode is changed at a relatively high speed), but its structure is not limited thereto. For example, the laser of the present invention can also be constructed as a single-mode tunable semiconductor laser which can change its wavelength while its polarization mode remains unchanged, or a single-mode semiconductor laser which can stably oscillate in one polarization mode in a single mode.

Specifically, the following configurations of three types can be adopted based on the above fundamental structure.

In a first configuration, the laser can oscillate light in two different polarization modes of TE mode and TM mode, the active layer generates a larger gain for the TM mode than for the TE mode, and the first phase shift region creates a phase shift of a quarter wavelength for the propagation light in the TE mode and creates a phase shift of a half wavelength for the propagation light in the TM mode.

In this case, $n_{TE}$, $n_{TM}$ and L are preferably determined such that $\alpha=(4\times L\times n_{TE}+2\times\lambda_{TE})/(4\times L\times n_{TM}+\lambda_{TM})$ is satisfied where $n_{TE}$ and $n_{TM}$ are effective refractive indices of the region other than the first phase shift region for the TE mode and the TM mode, respectively, $\lambda_{TE}$ and $\lambda_{TM}$ are wavelengths of the propagation light in the TE mode and the TM mode, respectively, $n_{1TE}$ and $n_{1TM}$ are effective refractive indices of the first phase shift region for the TE mode and the TM mode, respectively, $\alpha=n_{1TE}/n_{1TM}$ is a ratio between effective refractive indices of the first phase shift region for the TE mode and the TM mode, and L is a length in the cavity-axial direction of the first phase shift region.

In a second configuration, the laser can oscillate light in two different polarization modes of the TE mode and the TM mode, the active layer generates a larger gain for the TE mode than for the TM mode, and the first phase shift region creates a phase shift of a quarter wavelength for the propagation light in the TM mode and creates a phase shift of a half wavelength for the propagation light for the TE mode.

In this case, $n_{TE}$, $n_{TM}$ and L are preferably determined such that $\beta=(4\times L\times n_{TE}+\lambda_{TE})/(4\times L\times n_{TM}+2\times\lambda_{TM})$ is satisfied where $n_{TE}$ and $n_{TM}$ are effective refractive indices of the region other than the first phase shift region for the TE mode and the TM mode, respectively, $\lambda_{TE}$ and $\lambda_{TM}$ are wavelengths of the propagation light in the TE mode and the TM mode, respectively, $n_{1TE}$ and $n_{1TM}$ are effective refractive indices of the first phase shift region for the TE mode and the TM mode, respectively, $\alpha=n_{1TE}/n_{1TM}$ is a ratio between effective refractive indices of the first phase shift region for the TE mode and the TM mode, and L is a length in the cavity-axial direction of the first phase shift region.

In a third configuration, the laser can oscillate light in two different polarization modes, a second phase shift region is further formed in the waveguide, the second phase shift region extends along the cavity-axial direction and has a polarization dependency that an effective refractive index for propagation light of the second phase shift region differs from an effective refractive index for propagation light of a region of the waveguide other than the second phase shift region such that a phase shift of a quarter wavelength of the propagation light is created for the other of the two polarization modes and a phase shift of a half wavelength of the propagation light is created for one of the two polarization modes.

In this case, $n_{TE}$, $n_{TM}$, $L_1$ and $L_2$ are preferably determined such that $\alpha_1=(4\times L_1\times n_{TE}+\lambda_{TE})/(4\times L_1\times n_{TM}+2\times\lambda_{TM})$ and $\alpha_2=(4\times L_2\times n_{TE}+2\times\lambda_{TE})/(4\times L_2\times n_{TM}+\lambda_{TM})$ are satisfied where $n_{TE}$ and $n_{TM}$ are effective refractive indices of the region other than the first and second phase shift regions for the TE mode and the TM mode, respectively, $\lambda_{TE}$ and $\lambda_{TM}$ are wavelengths of the propagation light in the TE mode and the TM mode, respectively, $n_{1TE}$ and $n_{1TM}$ are effective refractive indices of the first phase shift region for the TE mode and the TM mode, respectively, $n_{2TE}$ and $n_{2TM}$ are effective refractive indices of the second phase shift region for the TE mode and the TM mode, respectively, $\alpha_1=n_{1TE}/n_{1TM}$ is a ratio between effective refractive indices of the first phase shift region for the TE mode and the TM mode, $\alpha_2=n_{2TE}/n_{2TM}$ is a ratio between effective refractive indices of the second phase shift region for the TE mode and the TM mode, and $L_1$ and $L_2$ are lengths in the cavity-axial direction of the first and second phase shift regions, respectively.

Further, in this case, the active layer is preferably formed to generate an approximately equal gain for each of the TE mode and the TM mode, thereby obtaining a single-mode semiconductor laser which can switch its oscillation polarization mode.

More specifically, the following structures may be adopted.

A shape of the first phase shift region can be different from a shape of the other region of the waveguide to achieve a phase shift action with the polarization dependency. In this case, a width of the first phase shift region may be different from a width of the other region of the waveguide, or a thickness of the first phase shift region may be different from a thickness of the other region of the waveguide, to achieve the phase shift action with the polarization dependency.

The active layer may be a tensile-strained active layer, or a quantum well active layer, to obtain a desired relation between gains for the two different polarization modes.

The active layer may be formed on a side of a substrate with respect to the diffraction grating, or on a side opposite to the substrate with respect to the diffraction grating.

The diffraction grating with different coupling coefficients for the two different polarization modes has a uniform pitch without a phase shift section over an entire length of the diffraction grating, thereby achieving a semiconductor laser with a simple structure which can be fabricated without requiring a complicated process.

Further, a first current injection unit for injecting a current into a region including the first phase shift region and a second current injection unit for injecting a current into a region lacking the first phase shift region may be formed.

A first current injection unit for injecting a current into a region including the first phase shift region and a second current injection unit for injecting a current into a region including the second phase shift region may be formed.

According to another aspect of the present invention, there is provided a light source apparatus including the above distributed feedback semiconductor laser which is constructed as a polarization switchable DFB laser, and a mode selector for selecting a component of a desired mode from a light output from the laser.

According to still another aspect of the present invention, there is provided an optical transmitter including a distributed feedback semiconductor laser which is constructed as a polarization switchable DFB laser, a controller for controlling a light output from the laser in accordance with a transmission signal, and a mode selector for selecting a component of a desired mode from the light output from the laser.

According to still another aspect of the present invention, there is provided an optical communication system for communicating over a light transmission line that transmits a signal from a transmitter side to a receiver side, which includes the above optical transmitter for transmitting light of a signal through the light transmission line, and a receiver for receiving and detecting an intensity-modulated signal transmitted from the laser through the light transmission line.

In those apparatuses and systems, the mode selector is set such that a light component in one of the two polarization modes can be selected.

In the above first and second configurations above, since only one polarization mode is actually used for signal transmission in the polarization modulating system, the structure is formed such that the single-mode oscillation can be achieved at least in the polarization mode to be used for the signal transmission. In addition, the polarization contention enough for the polarization switching can be established. Where the λ/4 phase shift is imparted only to the TE mode, since most conventional semiconductor lasers oscillate in the TE mode, there can be provided a structure which can oscillate in the TE mode in a single mode, can effect the polarization switching, and is applicable to apparatuses and systems designed for the conventional semiconductor lasers. Where the λ/4 shift is imparted only to the TM mode, the polarization contention can be readily effected by this phase shift means, even though a gain for the TE mode is larger than that for the TM mode in an ordinary bulk active layer or the like. A desired gain can be further readily obtained by a tensile-strained active layer.

In the third configuration above, either polarization can be used for the signal transmission, and in this case an active layer, which has approximately equal gains for TE mode and TM mode, is preferably used.

In the above fundamental structure, the single-mode oscillation in a desired polarization mode can be stably achieved with a relatively simple structure. When gains for the two polarization modes are competitive, or an appropriately-designed active layer is used, a polarization switchable laser can be accurately attained. Further, since the length of the phase shift region is quite large (for example, from several tens of μm to 100 μm), hole burning can be suppressed and polarization switching operations can be stabilized.

The operation principle of each of the three configurations based on the fundamental structure will be described.

FIGS. 2A and 2B show the first configuration of the laser of the present invention. As illustrated in FIGS. 2A and 2B, the laser includes a substrate 1, an active layer 2, a light guide layer 3, a clad layer 4, contact layer (portions 5a and 5b), two upper electrodes 6a and 6b, a diffraction grating 7 with a uniform pitch Λ, a common lower electrode 8, a structurally built-in TE-mode phase shift region 9, and a stripe waveguide 10. A relatively large tensile strain is introduced into the active layer 2 such that a gain for the TM mode is larger than that for the TE mode. The length in the cavity-axial direction of the phase shift region 9 is much larger than a conventional λ/4 shift section which attains the phase shift employing a λ/4 deviation of a pitch of the grating. Such a conventional λ/4 shift section inherently cannot be polarization-dependent.

Where the following notations have respectively the above definitions, the following two relations (especially, relation (1) is indispensable) must be satisfied in the phase shift region 9 in order for the TE mode to receive a λ/4 shift (λ/4(2n+1), n being an integer):

$$(n_{1TE}-n_{TE}) \times L = \lambda_{TE}/4 \quad (1),$$

and $$(n_{1TM}-n_{TM}) \times L = \lambda_{TM}/2 \quad (2).$$

From the two relations, $n_{TE}$, $n_{TM}$ and L need to be determined such that the following relation (3) is satisfied:

$$\alpha = (4 \times L \times n_{TE} + 2 \times \lambda_{TE})/(4 \times L \times n_{TM} + \lambda_{TM}) \quad (3).$$

Under the above conditions, a phase shift received by light in the TM mode after a single reciprocative path thereof in the cavity is λ and the phase of the light after the single reciprocative path coincides with the phase of original light, so the phase shift region 9 does not at all influence the light in the TM mode. Thus, only light in the TE mode effectively receives the phase shift, and hence a stable single-mode oscillation can be achieved in the TE mode. Here, since the TM mode never receives the phase shift action, the polarization switching can be stably achieved when the gain for the TM mode is made larger than that for the TE mode in the active layer to obtain the polarization contention. (When only a stable single-mode oscillation in the TE mode is desired, only a gain for the TE mode has to be sufficient.) Thus, there are structurally provided the phase shift with the polarization dependency for acting on the TE mode only and the gain adjustment for facilitating the polarization contention, so a stable single-mode oscillation in the TE mode and the polarization contention can be obtained. Further, the phase. shift region 9 can be elongated, so adverse influences, such as hole burning from concentrating light in the phase shift portion can be effectively reduced and the operation can be stabilized.

FIGS. 7A and 7B show the second configuration of the laser of the present invention. As illustrated in FIGS. 7A and 7B, the laser includes a substrate 21, an active layer 22, a light guide layer 23, a clad layer 24, contact layer (portions 25a and 25b), two upper electrodes 26a and 26b, a diffraction grating 27 with a uniform pitch Λ, a common lower electrode 28, a structurally built-in TM-mode phase shift region 29 with a length L in the cavity-axial direction, and a stripe waveguide 30. In the active layer 22, a gain for the TM mode is made close to but smaller than that for the TE mode. In a bulk active layer, the gain for the TE mode is larger than that for the TM mode, so a degree of freedom for designing the active layer can be increased.

Where the following notations have respectively the above definitions, the following two relations (especially, relation (4) is indispensable) must be satisfied in the phase shift region 29 in order for the TM mode to receive a λ/4 phase shift:

$$(n_{1TE}-n_{TE}) \times L = \lambda_{TE}/2 \quad (4),$$

and $$(n_{1TM}-n_{TM}) \times L = \lambda_{TM}/4 \quad (5).$$

From the two relations, $n_{TE}$, $n_{TM}$ and L need to be determined such that the following relation (6) is satisfied:

$$\alpha = (4 \times L \times n_{TE} + \lambda_{TE})/(4 \times L \times n_{TM} + 2 \times \lambda_{TM}) \quad (6).$$

Under the above conditions, a phase shift received by light in the TE mode after a single reciprocative path thereof in the cavity is λ and the phase of the light after the single reciprocative path coincides with the phase of the original light wave, so the phase shift region 29 does not at all influence the light in the TE mode. Thus, only light waves in the TM mode effectively receive the phase shift, and hence a stable single-mode oscillation can be achieved in the TM mode. Here, since the TE mode never receives the phase shift action, the polarization contention can be made likely to occur by making the gain for the TE mode larger than that for the TM mode. (When only a stable single-mode oscillation in the TM mode is desired, only a gain for the TM mode has to be made sufficient.) Such gain adjustment can be achieved by introducing a relatively small tensile strain into the active layer 22.

Thus, there are structurally provided the phase shift with the polarization dependency for acting on the TM mode only and the gain adjustment for facilitating the polarization contention, so a stable single-mode oscillation in the TM mode and the polarization contention can be obtained. Also in this case, the phase shift region 29 can be elongated, so adverse influences, such as the hole burning from concentrating light in the phase shift portion can be effectively reduced and the operation can be stabilized.

FIGS. 10A and 10B show the third configuration of the laser of the present invention. As illustrated in FIGS. 10A and 10B, the laser includes a substrate 31, an active layer 32, a grating layer 33, a clad layer 34, contact layer (portions 35a and 35b), two upper electrodes 36a and 36b, a diffraction grating 37 with a uniform pitch Λ, a common lower electrode 38, a structurally built-in first phase shift region 39 with a length L in the cavity-axial direction, a structurally built-in second phase shift region 40 with a length $L_2$ in the cavity-axial direction, and a stripe waveguide 41. In the active layer 32, gains for TE mode and TM mode are made approximately equal. This can be achieved by introducing an appropriate tensile strain into the active layer 32.

Where the following notations have respectively the above definitions, the following two relations (in this case, relations (7) and (8) are indispensable since a single-mode oscillation is required for each polarization mode) must be satisfied in the first phase shift region 39 in order for the TM mode to receive a λ/4 shift:

$$(n_{1TE} - n_{TE}) \times L_1 = \lambda_{TE}/2 \qquad (7),$$

and $$(n_{1TM} - n_{TM}) \times L_1 = \lambda_{TM}/4 \qquad (8).$$

From the two relations, $n_{TE}$, $n_{TM}$ and $L_1$ need to be determined such that the following relation (9) is satisfied.

$$\alpha_1 = (4 \times L_1 \times n_{TE} + \lambda_{TE})/(4 \times L_1 \times n_{TM} + 2 \times \lambda_{TM}) \qquad (9)$$

Under the above conditions, a phase shift received by light in the TE mode after a single reciprocative path thereof in the cavity is λ, and the phase of the light after the single reciprocative path coincides with the phase of original light wave in the first phase shift region 39, so the phase shift region 39 does not at all influence the light in the TE mode. Thus, only light in the TM mode effectively receives the phase shift.

Similarly, the following two relations (also in this case, relations (10) and (11) are indispensable because of the above reason) must be satisfied in the second phase shift region 40 in order for the TE mode to receive a λ/4 phase shift:

$$(n_{2TE} - n_{TE}) \times L_2 = \lambda_{TE}/4 \qquad (10)$$

$$(n_{2TM} - n_{TM}) \times L_2 = \lambda_{TM}/2 \qquad (11)$$

From the two relations, $n_{TE}$, $n_{TM}$ and $L_2$ need to be determined such that the following relation (12) is satisfied:

$$\alpha_2 = (4 \times L_2 \times n_{TE} + 2 \times \lambda_{TE})/(4 \times L_2 \times n_{TM} + \lambda_{TM}) \qquad (12).$$

Thus, only the TM mode effectively receives a λ/4 phase shift in the first phase shift region 39 while only the TE mode effectively receives a λ/4 phase shift in the second phase shift region 40, so that single-mode oscillations in both the TE mode and the TM mode and the polarization contention can be achieved. Further, the phase shift regions 39 and 40 can be elongated, so adverse influences, such as the hole burning from concentrating light in the phase shift portions can be effectively reduced and the operation can be stabilized.

These advantages and others will be more readily understood in connection with the following detailed description of the preferred embodiments in conjunction with the drawings.

BRIEF DESCRIPTION OF THE DRAWINGS

FIGS. 12A and 12B are views illustrating, respectively, a cross-section taken along a cavity-axial direction, and a top plane of a sixth embodiment of a DFB semiconductor laser according to the present invention.

DESCRIPTION OF THE PREFERRED EMBODIMENTS

First Embodiment

Figure 1:
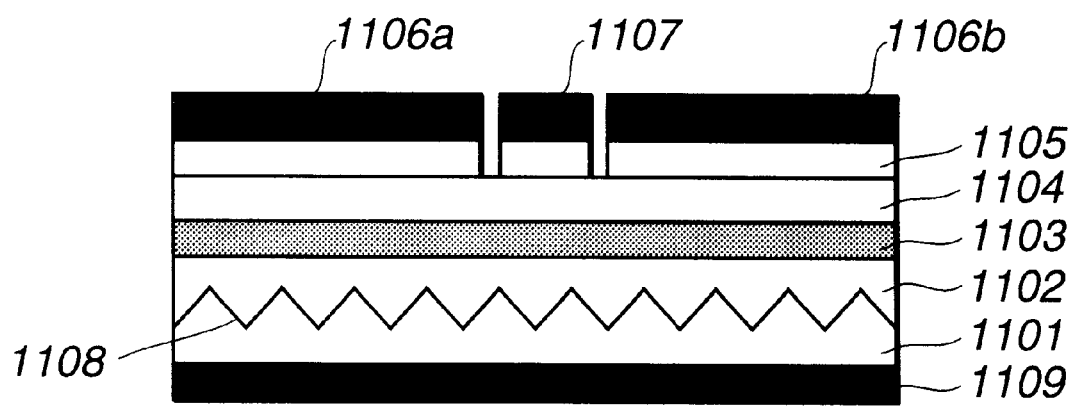
FIG. 1 is a cross-sectional view taken along a cavity-axial direction illustrating a conventional DFB semiconductor laser.
Figure 2A:
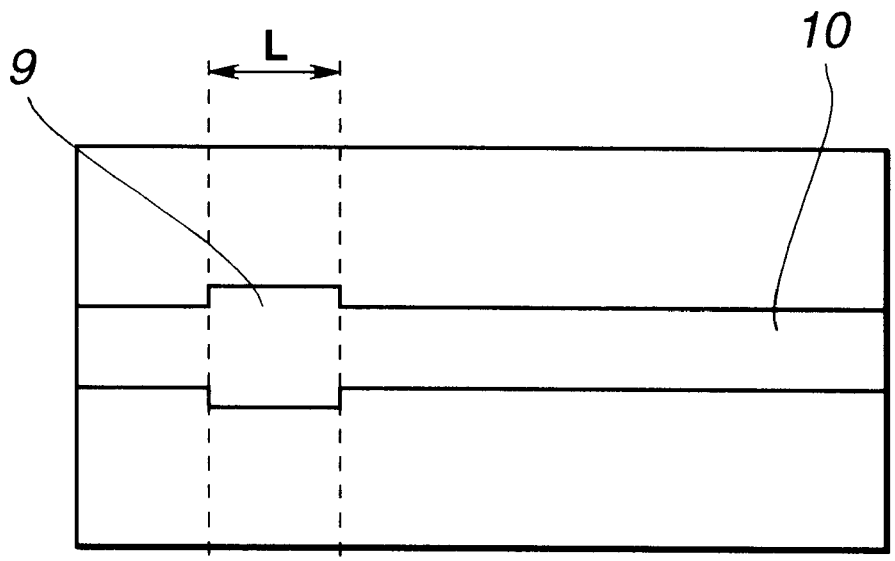
FIGS. 2A and 2B are views illustrating, respectively, a cross-section taken along a cavity-axial direction and, a top plane of a DFB semiconductor laser of the present invention having a first configuration.
Figure 2B:
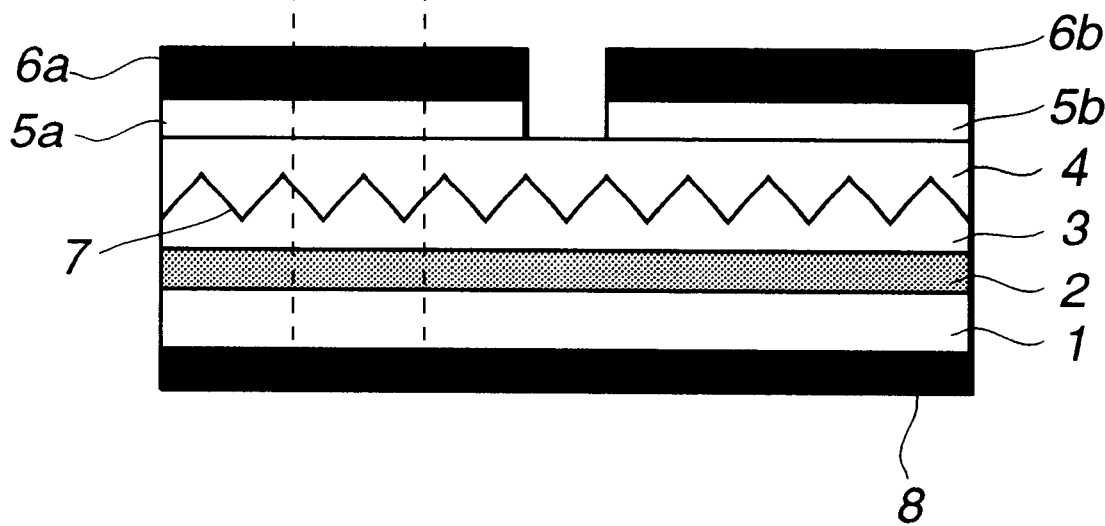
Figure 3A:
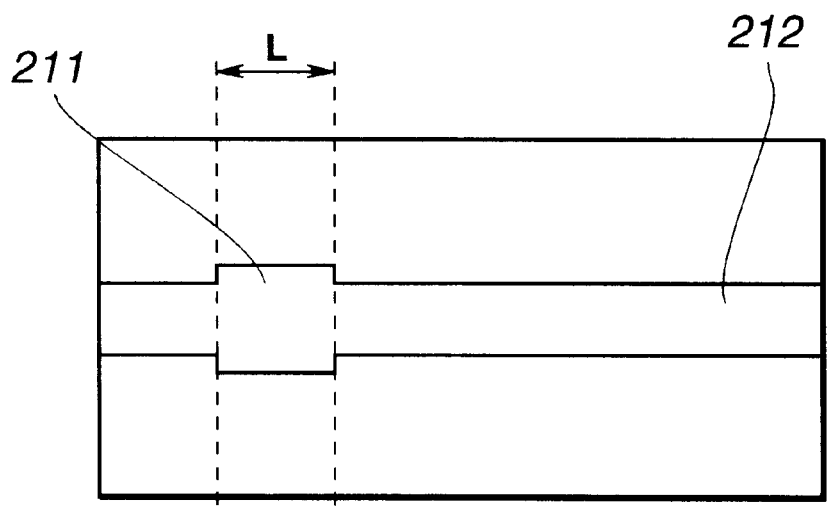
FIGS. 3A and 3B are views illustrating, respectively, a cross-section taken along a cavity-axial direction, and a top plane of a first embodiment of a DFB semiconductor laser according to the present invention.
Figure 3B:
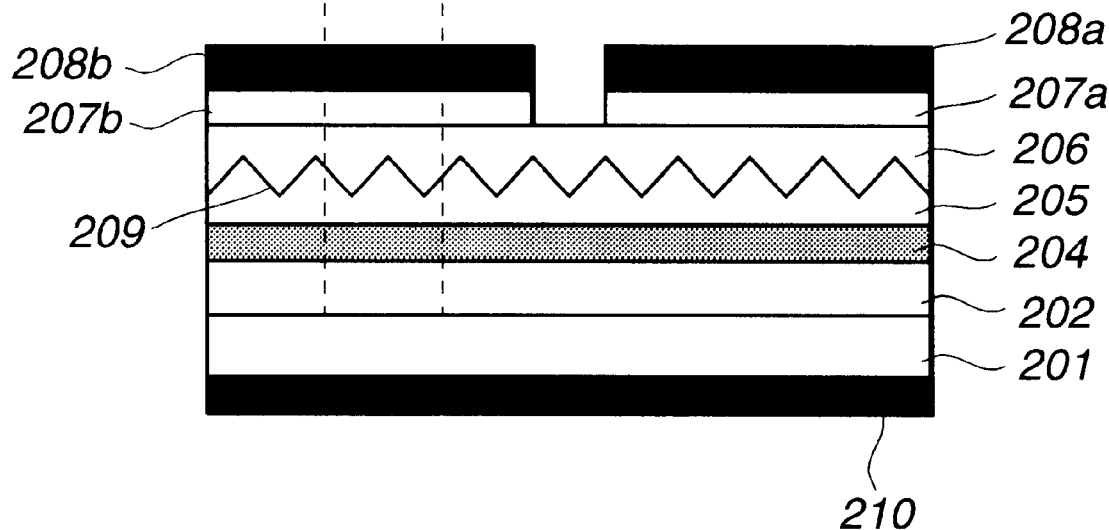

A first embodiment of a DFB semiconductor laser is illustrated in FIGS. 3A and 3B. FIG. 3A illustrates a plan view, and FIG. 3B, a cross-sectional view, taken along the cavity-axial direction. In the first embodiment, a phase shift region 211 is formed in a stripe-shaped waveguide 212. The phase shift region 211 is polarization-dependent such that an effect of $\lambda/4$ phase shift exists only for the TE mode, but not for the TM mode. In this embodiment, a refractive index $n_{TE}$ for the TE mode is set to 3.217 in a waveguide region other than the phase shift region 211, and a refractive index $n_{TM}$ for the TM mode is set to 3.209 in the waveguide region other than the phase shift region 211. Further, the longitudinal length L of the phase shift region 211 is set to 100 $\mu$m, and the width of the phase shift region 211 is set such that a ratio $\alpha = n_{1TE}/n_{1TM}$ between refractive indices for TE mode and TM mode in the phase shift region 211 is 1.0037. Thus, the above relation (3) of $\alpha = (4 \times L \times n_{TE} + 2 \times \lambda_{TE})/(4 \times L \times n_{TM} + \lambda_{TM})$ is satisfied.

The layer structure of the first embodiment will be described. The structure includes an n-InP clad layer 202, a multiple quantum well active layer 204, a p-InGaAsP grating layer 205 (a light guide layer), a p-InP clad layer 206, a p-InGaAsP contact layer portions 207a and 207b which are laid down over an n-InP substrate 201. A uniform diffraction grating 209 is formed at the interface between the grating layer 205 and the clad layer 206. The contact layer portions 207A and 207B are formed along the cavity-axial direction. Electrodes 208a and 208b are respectively deposited on the two portions 207a and 207b of the contact layer. A common electrode 210 is formed on the bottom surface of the substrate 201.

The active layer 204 is formed of three pairs of 0.7%-tensile-strained InGaAs well layers with a thickness of 13 nm and InGaAsP barrier layers with a thickness of 10 nm and a bandgap wavelength $\lambda_g$ of 1.15 $\mu$m. Those well and barrier layers are all undoped. Thus, a gain for the TM mode is set larger than a gain for the TE mode.

Figure 4:
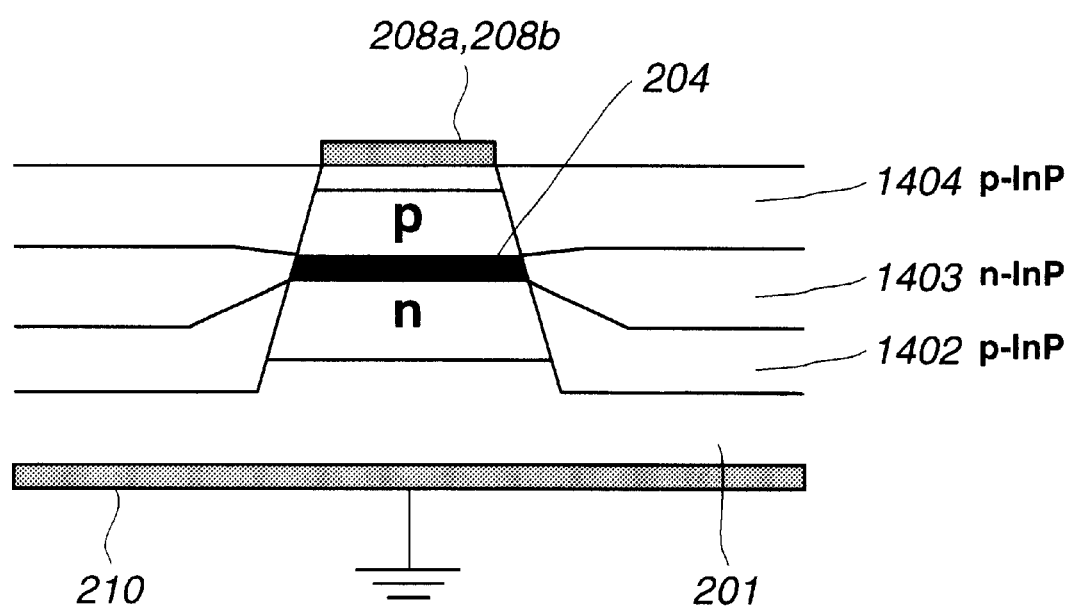
FIG. 4 is a cross-sectional view taken along a lateral direction of a DFB semiconductor laser of the present invention, illustrating a lateral confinement structure.

FIG. 4 illustrates a cross-sectional view of the first embodiment taken along a lateral direction perpendicular to the cavity-axial direction. As illustrated in FIG. 4, a burying (buried hetero) structure of p-InP layer 1402, n-InP layer 1403 and p-InP layer 1404 is employed as a confining structure for confining current and light in the lateral direction transverse to a light propagation direction. The burying structure has a PNP structure with the active layer 204 positioned in its center. Thus, undesirable current flow can be effectively reduced.

An example of a fabrication technique for a device according to this embodiment is provided below.

The n-InP clad layer 202, the undoped quantum well active layer 204, and the p-InGaAsP guide layer 205 are epitaxially grown serially in this order. In this case, a metal organic chemical vapor deposition (MOCVD) method is used as the epitaxial growth method, but other methods, such as a liquid phase chemical vapor deposition (LPCVD) method, a molecular beam epitaxy (MBE) method, and a chemical beam epitaxy (CBE) method, can also be used. Photoresist is then deposited on the p-InGaAsP guide layer 205, and a diffraction grating pattern is formed thereon by a holographic method using a He-Cd laser. A corrugated grating with a uniform pitch is then formed on the p-InGaAsP grating layer 205 using reactive ion beam etching (RIBE).

Crystallographic regrowth is performed on the p-InGaAsP guide layer 205 with the corrugated grating 209. In this case, an MOCVD method is used as the regrowth method, but other methods, such as a liquid phase epitaxy (LPE) method and the MBE method, can also be used. The p-InP clad layer 206 and the p-InGaAsP contact layer 207 are then formed using the MOCVD method. This completes the serial epitaxial growth process.

A stripe mask is then formed to form a channel waveguide, and a mesa-shaped channel stripe is formed using RIBE. Selective growth is performed only on surroundings of the stripe using the MOCVD method to bury the surroundings with the p-InP layer 1402, n-InP layer 1403 and p-InP layer 1404 as illustrated in FIG. 4. At this time, the n-InP layer 1403 is formed adjoining to the side of the active layer 204 to reduce the unwanted current. After the substrate 201 is lapped to a desired thickness and polished, metal films of Au/Au—Zn are deposited as the upper electrodes 208a and 208b and the lower electrode 210 and ohmic contact is carried out using alloying processing. Then, etching is conducted down to the cap layer 207 to create the two portions 207a and 207b electrically. Thus, the upper electrodes 208a and 208b and the two divided contact layer portions 207a and 207b are formed. Finally, the wafer is cleaved to a bar shape, and chipping, die-bonding to a stem and wire-bonding are carried out. The semiconductor laser device is thus completed.

Figure 5:
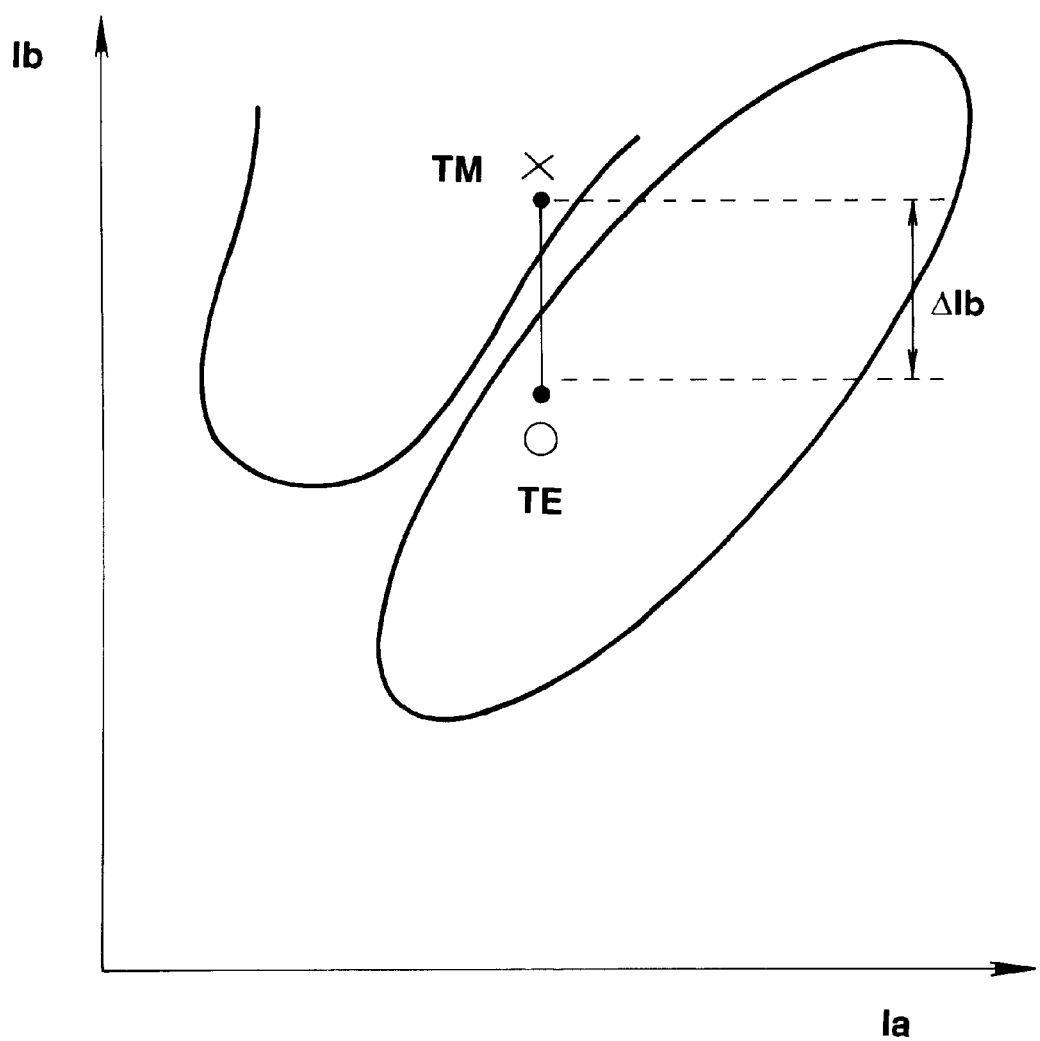
FIG. 5 is a view illustrating a relation between injection currents and oscillation polarization modes (TE mode and TM mode).

The operation or modulation of the device will be described. The relation between currents $I_a$ and $I_b$ injected into the two electrodes 208a and 208b and the oscillation polarization mode is illustrated in FIG. 5. The oscillation modes of the TE mode and the TM mode have proper zones, respectively. There is a transient zone, in which the oscillation mode is slightly unstable, between the oscillation zones of TE mode and TM mode. When an appropriate set of the two currents ($I_a$, $I_b$) is selected above oscillation thresholds, output in a desired polarization mode (TE mode or TM mode) can be obtained. For example, when the currents $I_a$ and $I_b$ are urged to a point × in FIG. 5, the laser is oscillated in the TM mode. Under this condition, when the current $I_b$, injected into the region including the phase shift region 211 through the electrode 208b, is slightly lowered, the laser comes to be urged to a point ○ and the oscillation mode instantly turns to the TE mode. More specifically, since the current injected into the region under the electrode 208b is slightly decreased, the refractive index in this region is slightly increased due to the plasma effect, and the Bragg wavelength is hence shifted to a longer side. Thus, the Bragg wavelength approaches the gain peak wavelength of the TE mode, and hence the oscillation in the TE mode occurs. That is, when the modulation current $\Delta I_b$ is superimposed on the bias current $I_b$, the polarization mode of an output signal of the laser is modulated.

The magnitude of the modulation current $\Delta I_b$ is approximately equal to that of frequency shift keying (FSK) modulation, i.e., about several milliamperes. When use is made only of the TE-mode oscillation that can be effected in a single mode in this case, a large extinction ratio can be achieved and the laser can be operated with a small chirping. When the polarization-modulated optical signal from the laser is transmitted through a polarization-mode selector, such as a polarizer and a polarization prism, to obtain only the TE-mode component, an amplitude-modulated signal (amplitude shift keying) can be created.

Figure 13:
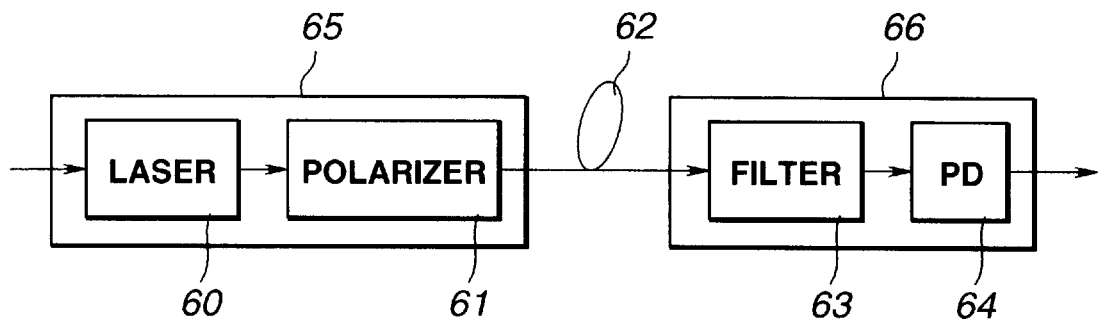
FIG. 13 is a block diagram illustrating an optical transmission system using a laser of the present invention.

FIG. 13 schematically illustrates an optical transmission system using a device of the present invention. A signal emitted from a transmitter 65 is transmitted through an optical fiber 62 and detected by a receiver 66. In a wavelength multiplexing system, a wavelength filter 63 is provided before a photodetector 64 accordingly. Thus, the ASK signal with a notably large extinction ratio and a small chirping can be obtained when a laser 60 of the present invention is polarization-modulated and the polarization-modulated output is processed by a polarizer 61. The characteristic of a small chirping makes it possible to use the above laser in a high-density wavelength multiplexing system. Its potentiality is thus very high.

Figure 14:
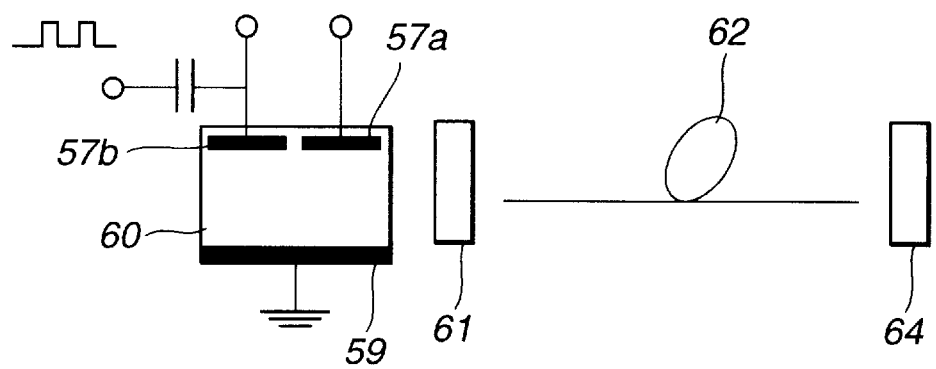
FIG. 14 is a view illustrating an intensity-modulated optical transmission system using a polarizer and a laser of the present invention.

FIG. 14 illustrates a current injection method for performing polarization modulation. In the method, the semiconductor laser 60 of the present invention is used, the intensity-modulated signal is transmitted, and the signal is received by the photodetector 64. In FIG. 14, the same reference numerals as those in FIG. 13 designate the same elements. A signal is added to a fixed bias current through a superposition circuit, such as a bias T, and the thus-generated current is injected through an electrode 57b of the semiconductor laser 60. The electrode 57b is positioned opposite to an electrode 57a on a light emission side of the laser 60 while common electrode 59 is formed on the bottom surface of laser 60. Embodiments to be described in the following can also be used similarly in such an optical transmission system.

Second Embodiment

Figure 6A:
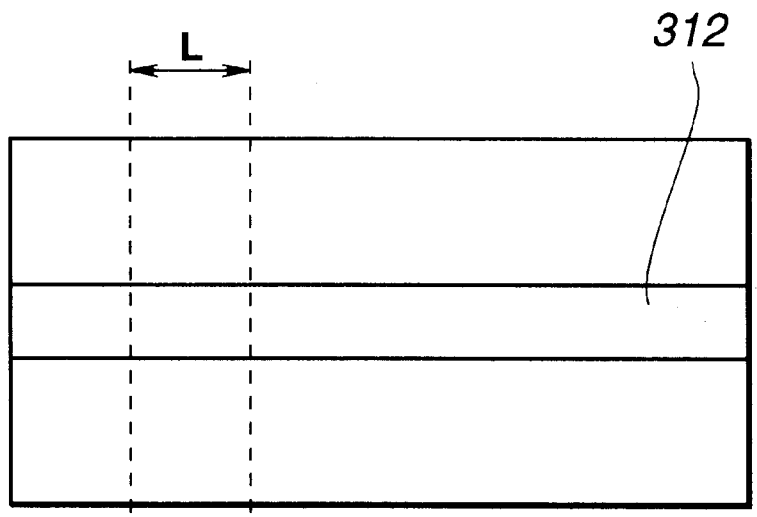
FIGS. 6A and 6B are views illustrating, respectively, a cross-section taken along a cavity-axial direction, and a top plane of a second embodiment of a DFB semiconductor laser according to the present invention.
Figure 6B:
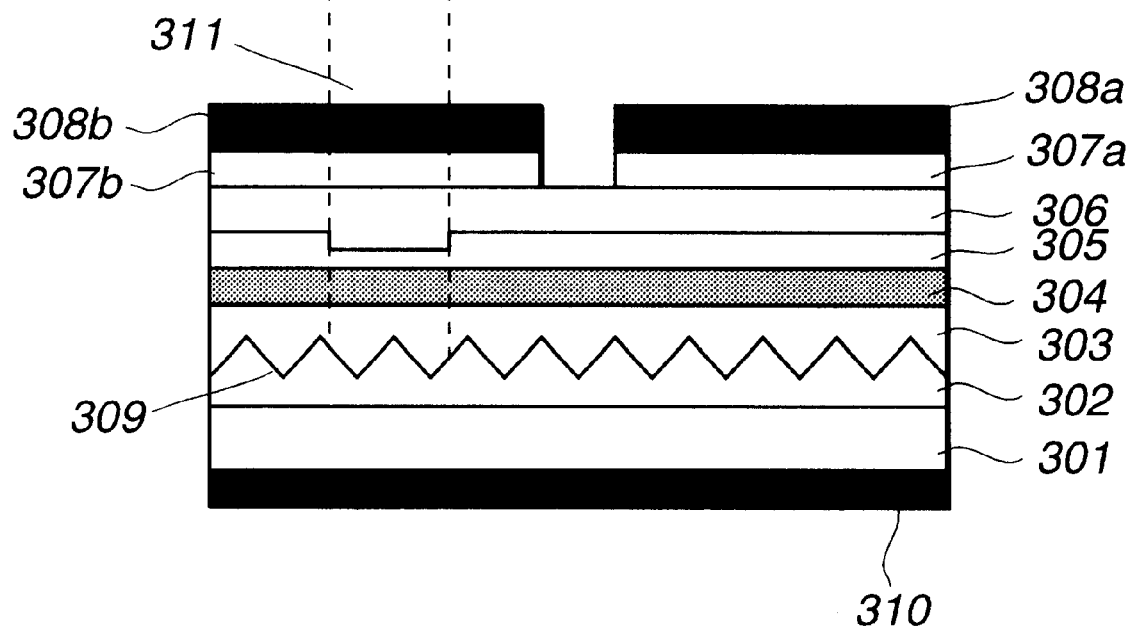
Figure 7A:
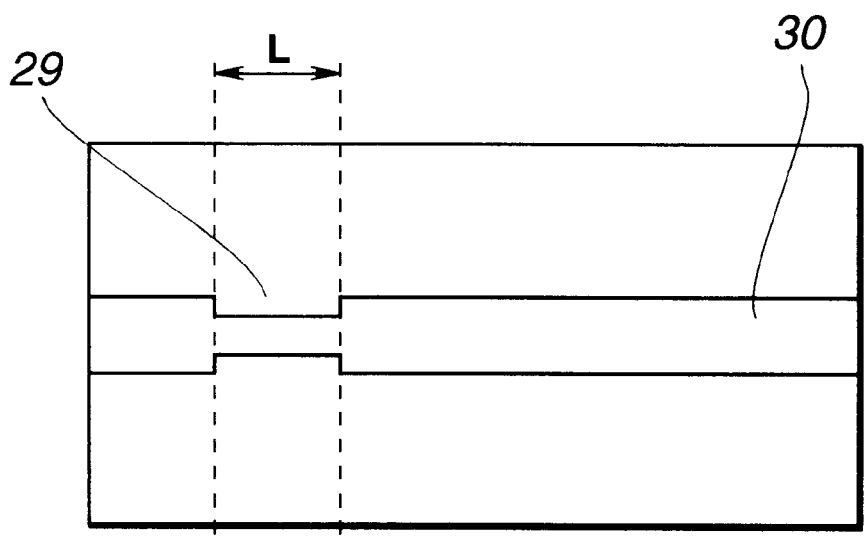
FIGS. 7A and 7B are views illustrating, respectively, a cross-section taken along a cavity-axial direction, and a top plane of a DFB semiconductor laser of the present invention having a second configuration.
Figure 7B:
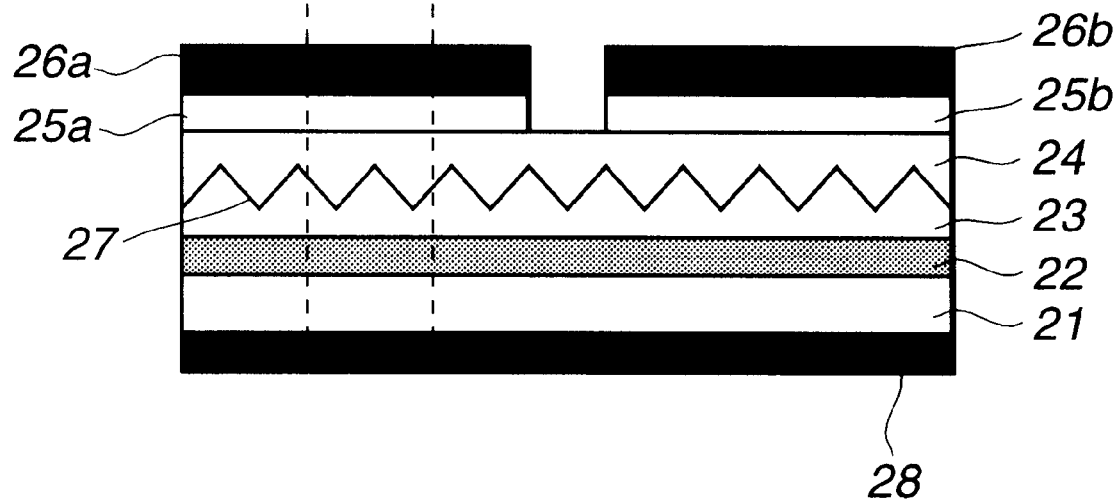

FIGS. 6A and 6B illustrate a second embodiment of the present invention which belongs to the first-type configuration similarly to the first embodiment. In the second embodiment, the width of a waveguide 312 is constant over the entire cavity, and instead the thickness of a guide layer 305 is changed in a phase shift region 311 to achieve a phase shift of $\lambda/4$ only for the TE mode.

The layer structure of the second embodiment will be described with reference to FIG. 6B. The structure includes an n-InP clad layer 302, an n-InGaAsP guide layer 303 with a bandgap wavelength $\lambda_g=1.3$ μm, a multiple quantum well (MQW) active layer 304, the p-InGaAsP guide layer 305, a p-InP clad layer 306, p-InGaAsP contact layer portions 307a and 307b which are laid down over an n-InP substrate 301. A uniform diffraction grating 309 is formed at the interface between the clad layer 302 and the guide layer 303. The contact layer portions 307a and 307b are formed along the cavity-axial direction. Metal electrodes 308a and 308b are respectively deposited on the two portions of the contact layer 307. A common metal electrode 310 is formed on the bottom surface of the substrate 301.

The active layer 304 is made of three pairs of 0.7%-tensile-strained InGaAs well layers with a thickness of 13 nm and InGaAsP barrier layers with a thickness of 10 nm and a bandgap wavelength $\lambda_g$ of 1.15 μm. Those well and barrier layers are all undoped. After the layers up to the MQW active layer 304 are laid down by the same process as that of the first embodiment, the guide layer 305 with a varied thickness in the phase shift region 311 is epitaxially grown by a selective growth by MOCVD. Then, the clad layer 306 and the contact layer 307 are formed in this order. The controllability of the thinned guide layer 305 in the phase shift region 311 formed by the selective growth is better than that of the changed width in the first embodiment.

The channel stripe is then formed by the same process as that of the first embodiment, and the confining structure in the lateral direction is formed similarly to the first embodiment (see FIG. 4).

FIG. 5 also illustrates the relation between currents $I_a$ and $I_b$ injected through the two electrodes 308a and 308b and the oscillation polarization modes of the second embodiment. When the bias point is set at the point ○ or × in FIG. 5 and the modulation component $\Delta I_b$ is superimposed on the bias current $I_b$, switching between the TE mode and the TM mode can be achieved. The amplitude of $\Delta I_b$ is about several milliamperes, and the effective extinction ratio (power ratio between the two modes) above 20 dB can be obtained. As in the first embodiment, the modulated signal is merely a polarization-modulated signal, as it is. Therefore, a polarizer is arranged before the semiconductor laser to convert the polarization-modulated signal to an intensity-modulated signal. Thus, when the polarizer is positioned with its optical axis accorded to the axial direction of a desired polarization mode (in this case, an electric-field direction of the TE mode), the intensity-modulated signal can be obtained with a large extinction ratio. The chirping of the laser of this embodiment during the polarization modulation is also very small, and it is below 1 Å when only the TE-mode output, which is a single-mode oscillation, is selected. Further, a modulation frequency band of the polarization modulation is more than 500 MHz. Moreover, neither expansion of the spectral line width due to hole burning, nor degradation of a linearity of response to the input due to hole burning is observed.

Third Embodiment

A third embodiment of a DFB semiconductor laser is illustrated in FIG. 8. The third embodiment belongs to a second-type configuration different from the first and second embodiments belonging to the first-type configuration.

Figure 8A:
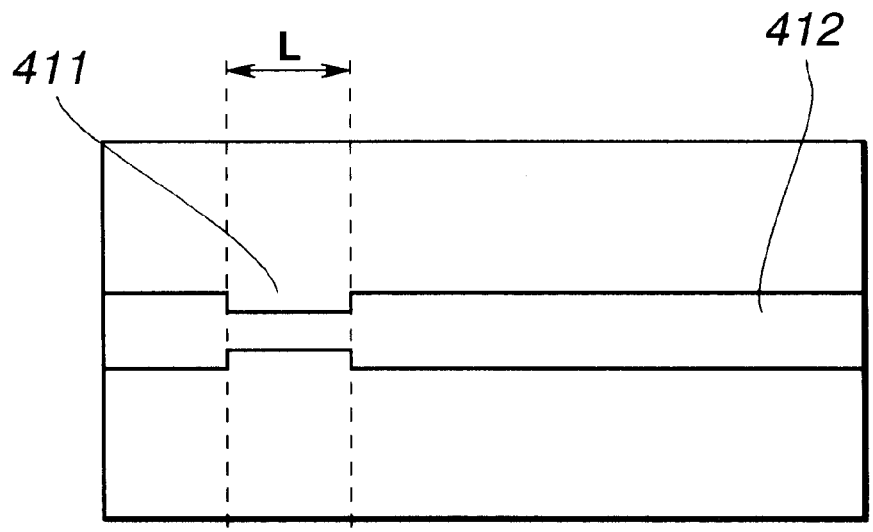
FIGS. 8A and 8B are views illustrating, respectively, a cross-section taken along a cavity-axial direction, and a top plane of a third embodiment of a DFB semiconductor laser according to the present invention.
Figure 8B:
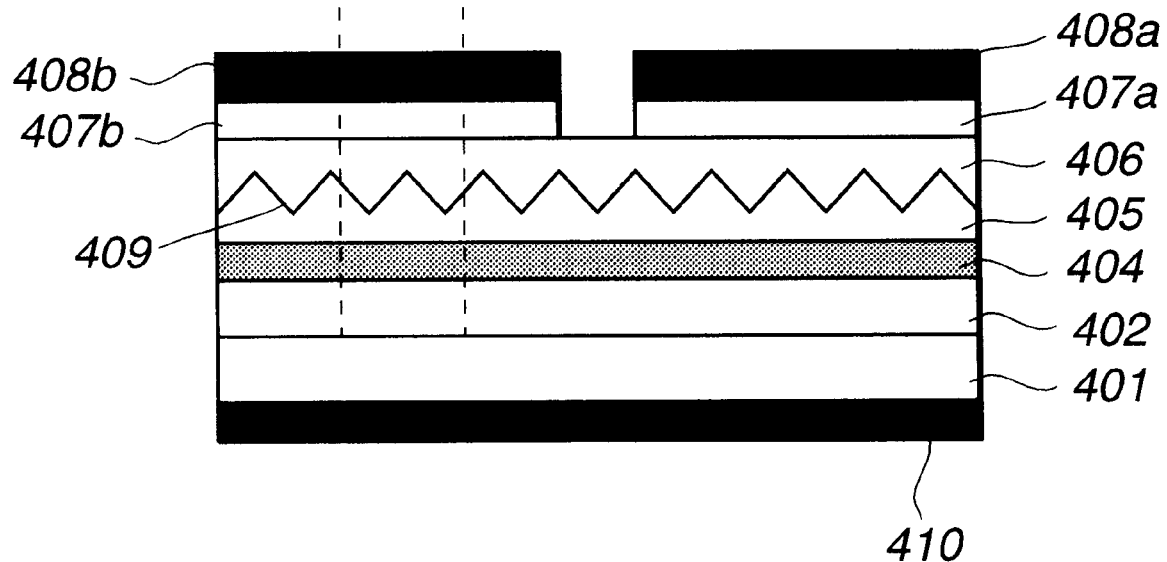

FIGS. 8A and 8B illustrate a plan view and a cross-sectional view, respectively, taken along the cavity-axial direction. In the third embodiment, a phase shift region 411 is formed in a stripe-shaped waveguide 412. The phase shift region 411 has the polarization dependency that the effect of a $\lambda/4$ phase shift exists only for the TM mode. In this embodiment, the index $n_{TE}$ for the TE mode is set to 3.217 in a waveguide region other than the phase shift region 411, and the index $n_{TM}$ for the TM mode is set to 3.209 in the waveguide region other than the phase shift region 411. Further, the longitudinal length L of the phase shift region 411 is set to 100 μm, and the width of the phase shift region 411 is set such that a ratio $\alpha=n_{1TE}/n_{1TM}$ between refractive indices for TE mode and TM mode in the phase shift region 411 is 1.00128. Thus, the above relation (6) of $\alpha=(4\times L\times n_{TE}+\lambda_{TE})/(4\times L\times n_{TM}+2\times\lambda_{TM})$ is satisfied.

The layer structure of the third embodiment will be described. The structure includes an n-InP clad layer 402, a multiple quantum well active layer 404, a p-InGaAsP grating layer 405 (a light guide layer), a p-InP clad layer 406, and p-InGaAsP contact layer portions 407a and 407b which are laid down over an n-InP substrate 401. A uniform diffraction grating 409 is formed at the interface between the grating layer 405 and the clad layer 406. The contact layer portions 407a and 407b are formed along the resonance direction. Electrodes 408a and 408b are respectively deposited on the two portions 407a and 407b of the contact layer. A common electrode 410 is formed on the bottom surface of the substrate 401.

The active layer 404 is formed of three pairs of 0.5%-tensile-strained InGaAs well layers with a thickness of 13 nm and InGaAsP barrier layers with a thickness of 10 nm and a bandgap wavelength $\lambda_g$ of 1.15 μm. Those well and barrier layers are all undoped. Gains for the TM mode and the TE mode are approximately equal when the tensile-strain amount of the active layer 404 is 0.6%. Therefore, a gain for the TE mode is set slightly greater than a gain for the TM mode in this embodiment by setting the tensile-strain amount to 0.5%.

FIG. 8B illustrates a cross-sectional view of the third embodiment taken along a direction perpendicular to the cavity-axial direction. The laser also has a current and light confinement structure in the lateral direction, and this structure may be the same as that of the first embodiment (see FIG. 4). Likewise, the device of this embodiment can be fabricated in the same manner as that of the first embodiment.

The operation or modulation of the device is also substantially the same as that of the above embodiments. That is, the relation between currents $I_a$ and $I_b$ injected through the two electrodes 408a and 408b and the oscillation polarization modes is substantially as illustrated in FIG. 5. The oscillation modes of the TE mode and the TM mode have proper zones, respectively. When an appropriate set of the two currents ($I_a$, $I_b$) is selected above oscillation thresholds, output in a desired polarization mode (TE mode or TM mode) can be obtained. For example, when the currents $I_a$ and $I_b$ are urged to a point ○ in FIG. 5, the laser is oscillated in the TE mode. Under this condition, when the current $I_b$, injected into the region including the phase shift region 411 through the electrode 408b, is slightly increased, the laser comes to be urged to a point × and the oscillation mode momentarily turns to the TM mode. More specifically, since the current injected into the region under the electrode 408b is slightly increased, the refractive index in this region is slightly lowered due to the plasma effect, and the Bragg wavelength is shifted to a shorter side. Thus, the Bragg wavelength approaches the gain peak wavelength of the TM mode, and hence oscillation in the TM mode occurs. Accordingly, when the modulation current $\Delta I_b$ is superimposed on the bias current $I_b$, the polarization mode of an output signal from the laser is modulated.

The magnitude of the modulation current $\Delta I_b$ is approximately equal to that of FSK modulation.

Fourth Embodiment

Figure 9A:
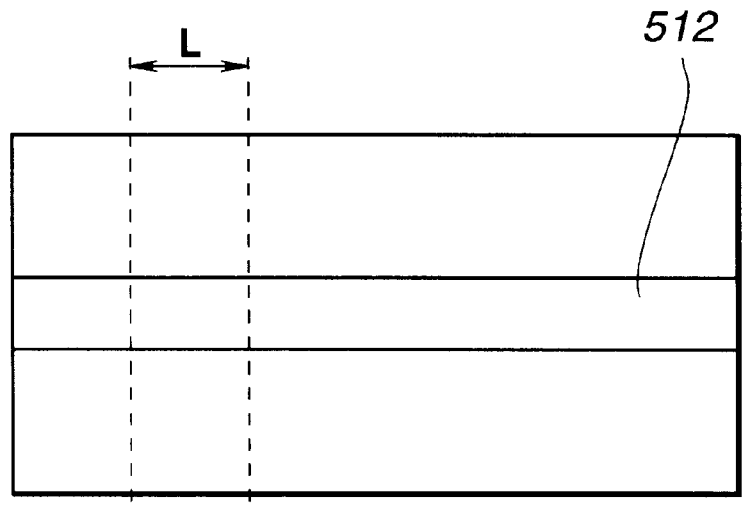
FIGS. 9A and 9B are views illustrating, respectively, a cross-section taken along a cavity-axial direction, and a top plane of a fourth embodiment of a DFB semiconductor laser according to the present invention.
Figure 9B:
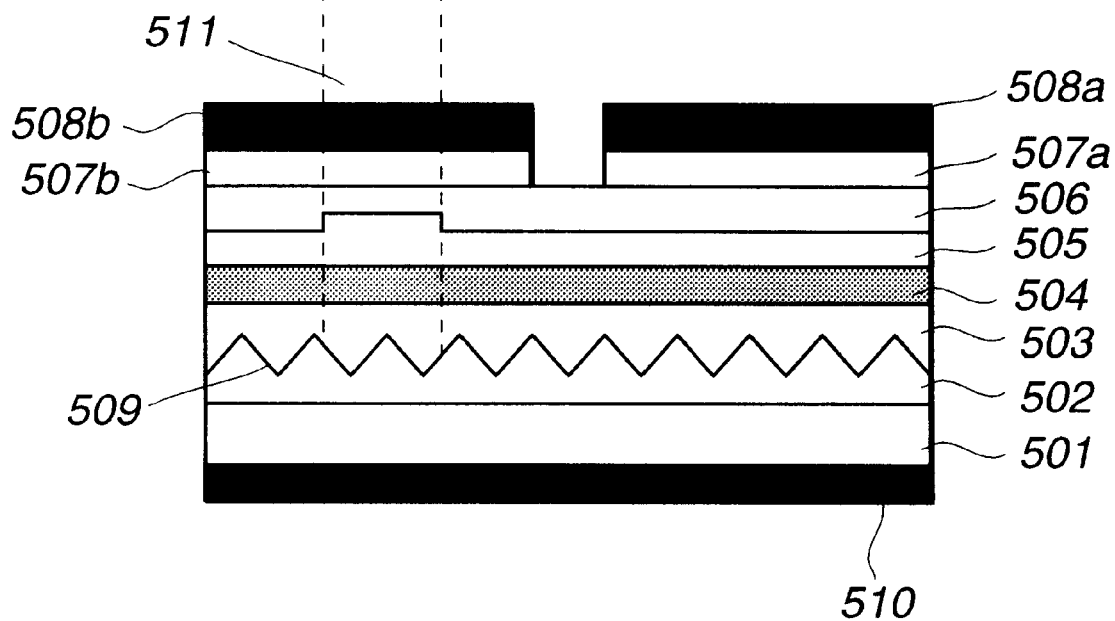
Figure 10A:
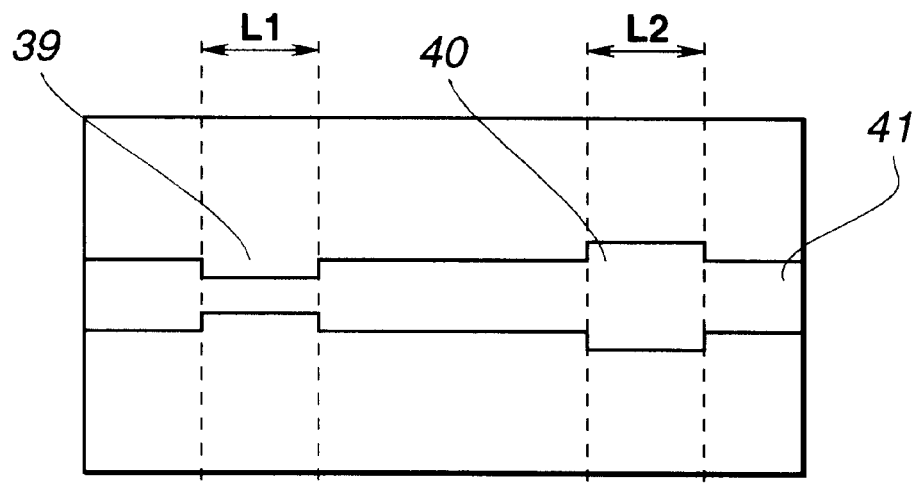
FIGS. 10A and 10B are views illustrating, respectively, a cross-section taken along a cavity-axial direction, and a top plane of a DFB semiconductor laser of the present invention having a third configuration.
Figure 10B:
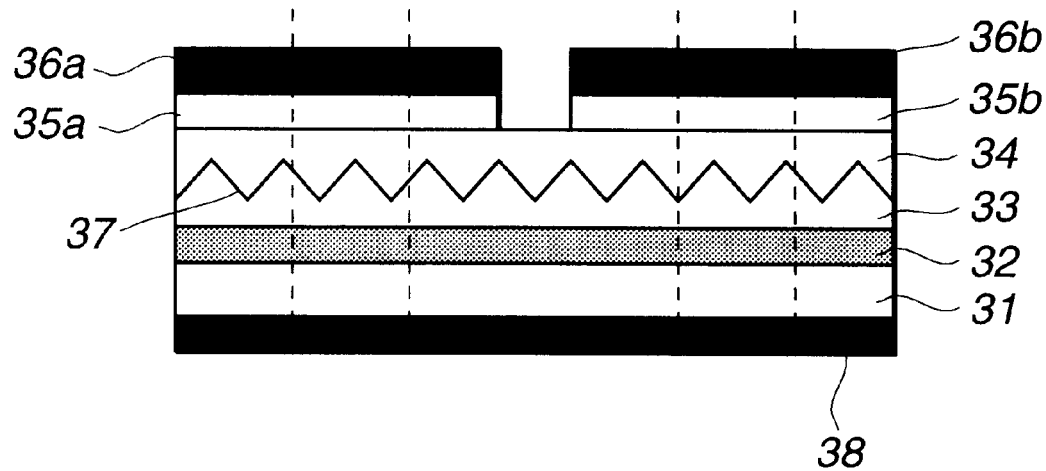

A fourth embodiment of a DFB semiconductor laser is illustrated in FIGS. 9A and 9B. The fourth embodiment is of the second configuration, as is the third embodiment. In the fourth embodiment, the width of a waveguide 512 is constant over the entire cavity, and instead the thickness of a guide layer 505 is changed in a phase shift region 511 to achieve a phase shift of λ/4 only for the TM mode.

FIGS. 9A and 9B illustrate, respectively, a plan view and a cross-sectional view taken along the cavity-axial direction. In this embodiment, the index $n_{TE}$ for the TE mode is set to 3.217 in a waveguide region other than the phase shift region 511, and the index $n_{TM}$ for the TM mode is set to 3.209 in the waveguide region other than the phase shift region 511. Further, the longitudinal length L of the phase shift region 511 is set to 100 μm, and the thickness of the guide layer 505 in the phase shift region 511 is set such that a ratio $\alpha=n_{1TE}/n_{1TM}$ between refractive indices for TE mode and TM mode in the phase shift region 511 is 1.00128. Thus, the above relation (6) of $\alpha=(4\times L\times n_{TE}+\lambda_{TE})/(4\times L\times n_{TM}+2\times\lambda_{TM})$ is satisfied.

The layer structure of the fouth embodiment will be described with reference to FIG. 9B. The structure includes an n-InP clad layer 502, an n-InGaAsP light guide layer 503 with a bandgap wavelength $\lambda_g$ of 1.3 μm, a multiple quantum well active layer 504, the p-InGaAsP guide layer 505, a p-InP clad layer 506, and p-InGaAsP contact layer portions 507a and 507b, which are laid down over an n-InP substrate 501. A uniform diffraction grating 509 is formed at the interface between the clad layer 502 and the guide layer 503. The contact layer portions 507a and 507b are provided along the cavity-axial direction. Electrodes 508a and 508b are respectively deposited on the two portions of the contact layer 507. A common electrode 510 is formed on the bottom surface of the substrate 501.

The active layer 504 is formed of three pairs of 0.5%-tensile-strained InGaAs well layers with a thickness of 13 nm and InGaAsP barrier layers with a thickness of 10 nm and a bandgap wavelength $\lambda_g$ of 1.15 μm. Those well and barrier layers are all undoped. Thus, a gain for the TE mode is set slightly larger than a gain for the TM mode.

After fabricating the wafer up to the MQW acive layer 504 by the same process as that of the third embodiment, the guide layer 505 with the phase shift region 511 of a varied thickness is epitaxially grown by a selective growth method of MOCVD. The clad layer 506 and the contact layer 507 are then formed in this order.

The operation or modulation and others of this embodiment are substantially the same as those of the third embodiment.

Fifth Embodiment

Figure 11A:
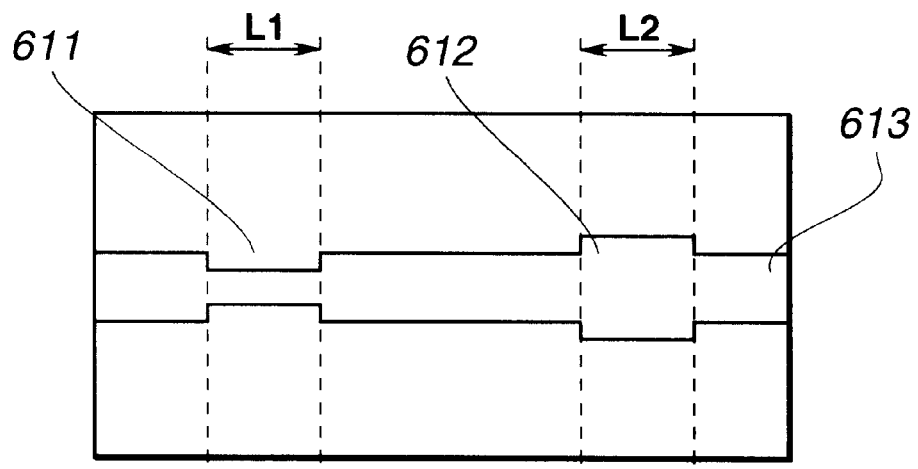
FIGS. 11A and 11B are views illustrating, respectively, a cross-section taken along a cavity-axial direction, and a top plane of a fifth embodiment of a DFB semiconductor laser according to the present invention.
Figure 11B:
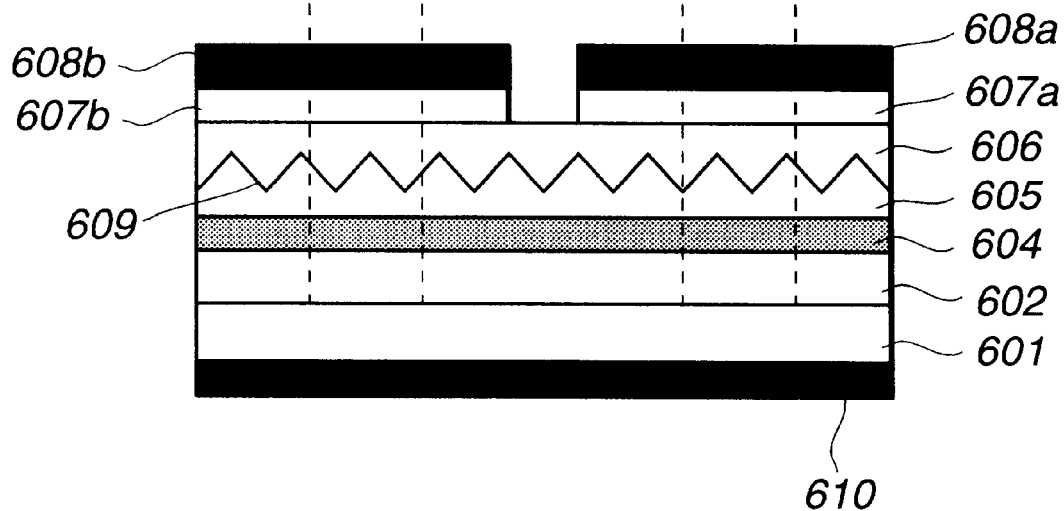

A fifth embodiment of a DFB semiconductor laser is illustrated in FIGS. 11A and 11B. The fifth embodiment is a third configuration different from the above embodiments. In the fifth embodiment, two phase shift regions 611 and 612 are formed in a stripe-shaped waveguide 613.

In this embodiment, the index $n_{TE}$ for the TE mode is set to 3.217 in a waveguide region other than the phase shift regions 611 and 612, and the index $n_{TM}$ for the TM mode is set to 3.209 in the waveguide region other than the phase shift regions 611 and 612. Further, the longitudinal length $L_1$ of the first phase shift region 611 having an effect of a λ/4 phase shift only for the TE mode is set to 100 μm, the longitudinal length $L_2$ of the second phase shift region 612 having an effect of a λ/4 phase shift only for the TM mode is also set to 100 μm, and the width of the first phase shift region 611 is set such that a ratio $\alpha_1=n_{11TE}/n_{21TM}$ between refractive indices for TE mode and TM mode in the first phase shift region 611 is 1.00128. Thus, the above relation (12) of $\alpha_1=(4\times L_1\times n_{1TE}+2\times\lambda_{TE})/(4\times L_1\times n_{1TM}+\lambda_{TM})$ is satisfied.

Further, the width of the second phase shift region 612 is set such that a ratio $\alpha_2=n_{21TE}/n_{21TM}$ between refractive indices for TE mode and TM mode in the second phase shift region 612 is 1.0037. Thus, the above relation (9) of $\alpha_2=(4\times L_2\times n_{1TE}+\lambda_{TE})/(4\times L_2\times n_{1TM}+2\times\lambda_{TM})$ is satisfied.

The layer structure of the fifh embodiment will be described with reference to FIG. 11B. The structure includes an n-InP clad layer 602, an undoped InGaAsP active layer 604 with approximately equal gains for the TE mode and the TM mode, a p-InGaAsP grating layer 605, a p-InP clad layer 606, and p-InGaAsP contact layer portions 607a and 607b which are laid down over an n-InP substrate 601. A uniform diffraction grating 609 is formed at the interface between the grating layer 605 and the clad layer 606. The contact layer 607 is divided into two portions along the cavity-axial direction. Electrodes 608a and 608b are respectively deposited on the two contact layer portions 607a and 607b. A common electrode 610 is formed on the bottom surface of the substrate 601.

The laser of this embodiment also has a current and light confinement structure in the lateral direction, and this structure may be the same as that of the above embodiments (see FIG. 4). Likewise, the device of this embodiment can be fabricated in the same manner as that of the above embodiments.

The operation or modulation of the device will be described. The relation between currents $I_a$ and $I_b$ injected through the two electrodes 608a and 608b and the oscillation polarization modes is substantially as illustrated in FIG. 5. The oscillation modes of the TE mode and the TM mode have proper zones, respectively. When an appropriate set of the two currents ($I_a$, $I_b$) is selected above oscillation thresholds, output in a desired polarization mode (TE mode or TM mode) can be obtained. For example, when the currents $I_a$ and $I_b$ are urged to a point ○ in FIG. 5, the laser is oscillated in the TE mode. Under this condition, when the current $I_b$ injected into the second DFB region through the electrode 608b is slightly increased, the laser comes to be urged to a point × and the oscillation mode momentarily turns to the TM mode. Thus, the output signal of this device is polarization-modulated by superimposing the modulating current $\Delta I_b$ on the bias current $I_b$.

The magnitude of the modulation current $\Delta I_b$ is approximately equal to that of FSK modulation, i.e., several milliamperes. Thus, a large extinction ratio is obtained, and the operation with very little chirping can be achieved. The polarization-modulated output from the laser may be transmitted through a mode selector, such as a polarizer or a polarization prism, that is arranged in front of the output end of the laser, so that only a desired polarization mode can be selected. An amplitude-modulated signal (ASK) can be thus obtained. In this embodiment, a component in either polarization mode is a single-mode signal, hence either one can be selected for use as a transmission signal.

Sixth Embodiment

A sixth embodiment of a DFB semiconductor laser is illustrated in FIGS. 12A and 12B. The sixth embodiment is of the third configuration, like the fifth embodiment. While the width of the stripe waveguide is partly changed in the phase shift regions to obtain the phase shift in the fifth embodiment, the width of a stripe waveguide 713 in the sixth embodiment is constant over the entire cavity, and instead the thickness of a guide layer 705 is partly changed in phase shift regions 711 and 712 in the sixth embodiment. Lengths and ratios between indices for TE mode and TM mode of the first and second phase shift regions 711 and 712 are the same as those of the fifth embodiment.

The layer structure of the sixth embodiment will be described with reference to FIG. 12B. The structure includes an n-InP clad layer 702, an n-InGaAsP guide layer 703, a multiple quantum well active layer 704 with approximately equal gains for TE and TM mode, a p-InGaAsP guide layer 705, a p-InP clad layer 706, and p-InGaAsP contact layer portions 707a and 707b, which are laid down over an n-InP substrate 701. A uniform diffraction grating 709 is formed at the interface between the clad layer 702 and the guide layer 703. The contact layer portions 707a and 707b are provided along the cavity-axial direction. Electrodes 708a and 708b are respectively deposited on the two portions of the contact layer 707. A common electrode 710 is formed on the bottom surface of the substrate 701.

The active layer 704 is formed of three pairs of 0.6%-tensile-strained InGaAs well layers with a thickness of 13 nm and InGaAsP barrier layers with a thickness of 10 nm and a bandgap wavelength $\lambda_g$ of 1.15 μm. Those well and barrier layers are all undoped. In the sixth embodiment, since the active layer 704 has a multiple quantum well structure, injection current can be effectively used to cause oscillation light and hence a lower threshold can be achieved.

The laser also has a current and light confinement structure in the lateral direction, and this structure may be the same as that of the above embodiments (see FIG. 4). Likewise, the device of this embodiment can be fabricated in the same manner as that of the above embodiments.

The operation or modulation of the device and others are substantially the same as those of the fifth embodiment.

Seventh Embodiment

Figure 15:
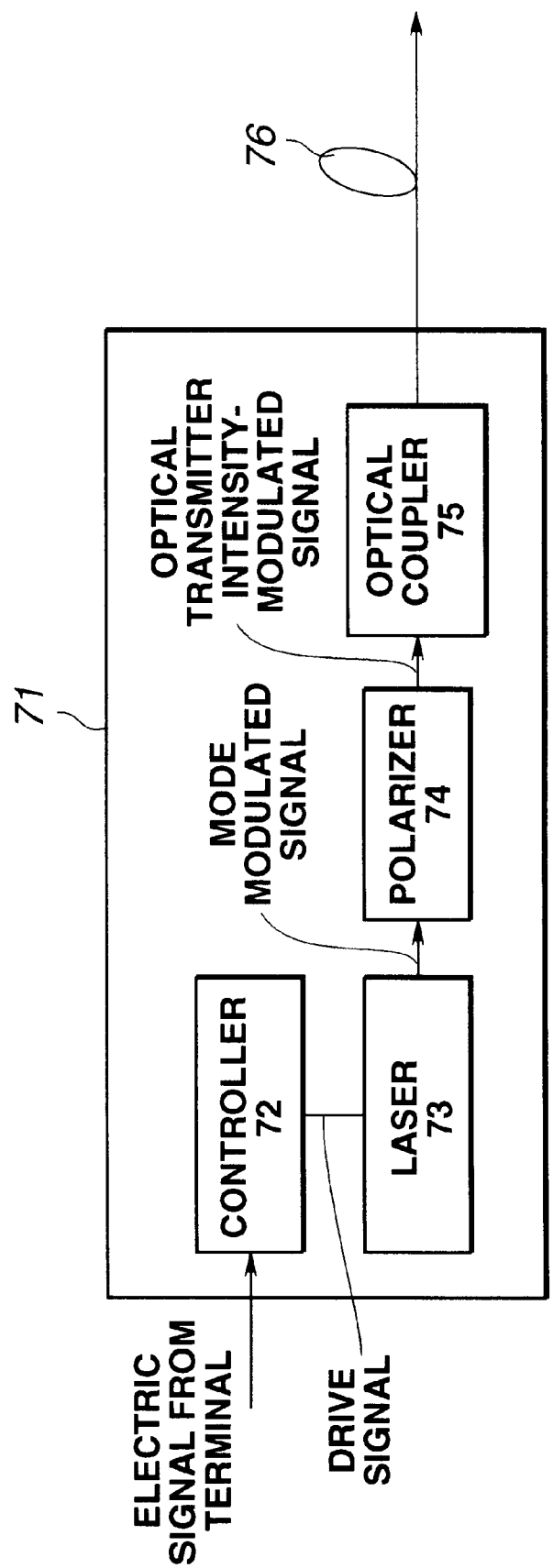
FIG. 15 is a block diagram illustrating a seventh embodiment of the present invention which is directed to an optical transmitter with a laser of the present invention.

FIG. 15 illustrates a seventh embodiment of the invention, an optical transmitter 71 using an optical device of the present invention. In FIG. 15, reference numeral 72 denotes a control circuit, reference numeral 73 denotes a laser device of the present invention driven by a drive signal from the control circuit 72, reference numeral 74 denotes a polarizer set such that only light in TE mode or TM mode can be transmitted therethrough, and reference numeral 75 denotes an optical coupling means, such as a lens, employed to couple an optical signal to a light transmission line 76, such as an optical fiber.

The operation of the seventh embodiment will be described. When an electric signal from a terminal is input into the controller 72, the controller 72 supplies to the semiconductor laser 73 the drive signal on which a modulating signal is superimposed. Accordingly, the laser 73 outputs a polarization-modulated optical signal corresponding to the drive signal from the controller 72. The polarization-modulated optical signal from the laser 73 is converted into an intensity-modulated signal by the polarizer 74. The intensity-modulated signal in TE mode or TM mode is coupled to the transmission line 76 by the optical coupler 75.

Eighth Embodiment

Figure 16:
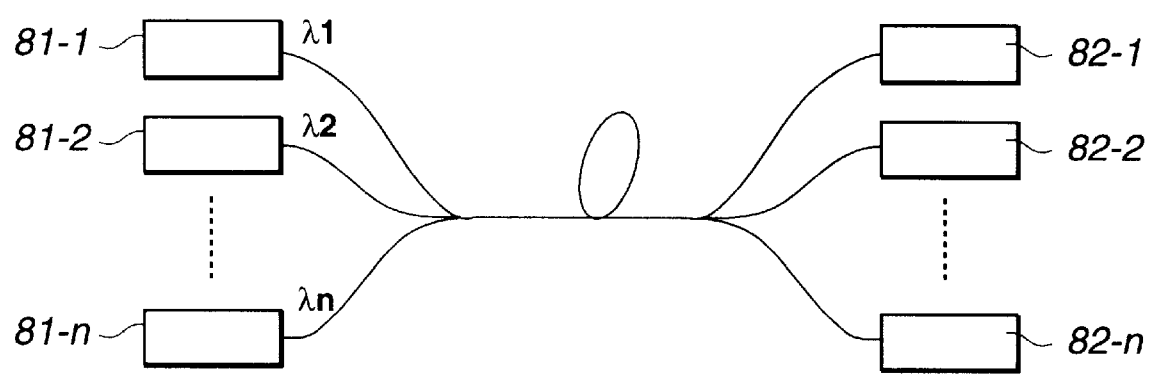
FIG. 16 is a block diagram illustrating an eighth embodiment of the present invention which is directed to a wavelength division multiplexing transmission system using lasers of the present invention.

FIG. 16 illustrates an eighth embodiment of the invention a star-type wavelength division multiplexing transmission system in which a device of the present invention is used.

In FIG. 16, reference numerals 81-1~81-n denote transmitters each including a polarization-switchable DFB semiconductor laser of the present invention and a polarizer, respectively. Reference numerals 82-1~82-n denote receivers each including a wavelength filer and a photodetector, respectively. The bias current injected into the DFB laser of the present invention can be controlled, like an ordinary DFB-LD, to change its output wavelength. In this embodiment, the transmitters 81-1~81-n supply ten signals of different wavelengths at intervals of 1 Å (n=10), respectively. As the wavelength filter in each of the receivers 82-1~82-n, a DFB-type waveguide filter with a half-width less than 0.5 Å is used, corresponding to the wavelength multiplicity. Thus, an optical signal at a desired wavelength can be selectively received. When adjacent wavelengths have different polarization modes (lasers of both the first and second configurations are used, or lasers of the third configuration are used), wavelength multiplexing can be achieved with very little crosstalk.

Except as otherwise disclosed herein, the various components shown in outline or block form in the drawing figures are individually well known in the laser device and optical communication arts, and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A distributed feedback semiconductor laser comprising:
a waveguide comprising an active layer and a diffraction grating, said waveguide extending along a cavity-axial direction and being defined such that propagation of light in two different polarization modes is permitted in said waveguide;
a plurality of electrodes arranged in series along said cavity-axial direction; and
a first phase shift region formed in -a waveguide part of said waveguide located under one of said plurality of electrodes,
wherein the waveguide part comprises said first phase shift region and a region other than said first phase shift region,
said first phase shift region extending along the cavity-axial direction and having a polarization dependency that an effective refractive index for propagating light of said first phase shift region differs from an effective refractive index for propagation light of the other region such that a phase shift of a quarter wavelength of the propagation light is created for one of the two polarization modes and a phase shift of a half wavelength of the propagation light is created for the other of the two polarization modes in said first phase shift region.

2. A distributed feedback semiconductor laser according to claim 1, the two different polarization modes being a transverse electric (TE) mode and a transverse magnetic (TM) mode, said active layer generating a larger gain for the transverse magnetic mode than for the transverse electric mode, and said first phase shift region creating a phase shift of a quarter wavelength for the propagation light in the transverse electric mode and creating a phase shift of a half wavelength for the propagation light in the transverse magnetic mode.

3. A distributed feedback semiconductor laser according to claim 2, said laser satisfying: $\alpha=(4\times L\times n_{TE}+2\times\lambda_{TE})/(4\times L\times n_{TM}+\lambda_{TM})$, where $n_{TE}$ and $n_{TM}$ are effective refractive indices of said region other than said first phase shift region for the TE mode and the TM mode, respectively, $\lambda_{TE}$ and $\lambda_{TM}$ are wavelengths of the propagation light in the TE mode and the TM mode, respectively, $n_{1TE}$ and $n_{1TM}$ are effective refractive indices of said first phase shift region for the TE mode and the TM mode, respectively, $\alpha=n_{1TE}/n_{1TM}$ is a ratio between effective refractive indices of said first phase shift region for the TE mode and TM mode, and L is a length in the cavity-axial direction of said first phase shift region.

4. A distributed feedback semiconductor laser according to claim 1, the two different polarization modes being a transverse electric (TE) mode and a transverse magnetic (TM) mode, said active layer generating a larger gain for the transverse electric mode than for the transverse magnetic mode, and said first phase shift region creating a phase shift of a quarter wavelength for the propagation light in the transverse magnetic mode and creating a phase shift of a half wavelength for the propagation light for the transverse electric mode.

5. A distributed feedback semiconductor laser according to claim 4, said laser satisfying: $\alpha=(4\times L\times n_{TE}+\lambda_{TE})/(4\times L\times n_{TM}+2\times\lambda_{TM})$, where $n_{TE}$ and $n_{TM}$ are effective refractive indices of said region other than said first phase shift region for the TE mode and the TM mode, respectively, $\lambda_{TE}$ and $\lambda_{TM}$ are wavelengths of the propagation light in the TE mode and the TM mode, respectively, $n_{1TE}$ and $n_{1TM}$ are effective refractive indices of said first phase shift region for the TE mode and the TM mode, respectively, $\alpha=n_{1TE}/n_{1TM}$ is a ratio between effective refractive indices of said first phase shift region for the TE mode and TM mode, and L is a length in the cavity-axial direction of said first phase shift region.

6. A distributed feedback semiconductor laser according to claim 1, further comprising a second phase shift region formed in said waveguide, said second phase shift region extending along the cavity-axial direction and having a polarization dependency that an effective refractive index for propagation light of said second phase shift region differs from an effective refractive index for propagation light of a region of said waveguide other than said second phase shift region such that a phase shift of a quarter wavelength of the propagation light is created for the other of the two polarization modes and a phase shift of a half wavelength of the propagation light is created for one of the two polarization modes.

7. A distributed feedback semiconductor laser according to claim 6, said laser satisfying: $\alpha_1=(4\times L_1\times n_{TE}+\lambda_{TE})/(4\times L_1\times n_{TM}+2\times\lambda_{TM})$ and $\alpha_2=(4\times L_2\times n_{TE}+2\times\lambda_{TE})/(4\times L_2\times n_{TM}+\lambda_{TM})$, where $n_{TE}$ and $n_{TM}$ are effective refractive indices of said region other than said first and second phase shift regions for the TE mode and the TM mode, respectively, $\lambda_{TE}$ and $\lambda_{TM}$ are wavelengths of the propagation light in the TE mode and the TM mode, respectively, $n_{1TE}$ and $n_{1TM}$ are effective refractive indices of said first phase shift region for the TE mode and the TM mode, respectively, $n_{2TE}$ and $n_{2TM}$ are effective refractive indices of said second phase shift region for the TE mode and the TM mode, respectively, $\alpha_1=n_{1TE}/n_{1TM}$ is a ratio between effective refractive indices of said first phase shift region for the TE mode and TM mode, $\alpha_2=n_{2TE}/n_{2TM}$ is a ratio between effective refractive indices of said second phase shift region for the TE mode and TM mode, and $L_1$ and $L_2$ are lengths in the cavity-axial direction of said first and second phase shift regions, respectively.

8. A distributed feedback semiconductor laser according to claim 6, said active layer generating an approximately equal gain in each of the transverse magnetic mode and the transverse electric mode.

9. A distributed feedback semiconductor laser according to claim 1, a shape of said first phase shift region being different from a shape of said other region of said waveguide.

10. A distributed feedback semiconductor laser according to claim 9, a width of said first phase shift region being different from a width of said other region of said waveguide.

11. A distributed feedback semiconductor laser according to claim 9, a thickness of said first phase shift region being different from a thickness of said other region of said waveguide.

12. A distributed feedback semiconductor laser according to claim 1, said active layer comprising a tensile-strained active layer.

13. A distributed feedback semiconductor laser according to claim 1, said active layer comprising a quantum well active layer.

14. A distributed feedback semiconductor laser according to claim 1, further comprising a substrate, said active layer being formed in said laser closer to said substrate than said diffraction grating is formed.

15. A distributed feedback semiconductor laser according to claim 1, further comprising a substrate, and said active layer being formed in said laser further from said substrate than said diffraction grating is formed.

16. A distributed feedback semiconductor laser according to claim 1, said diffraction grating having a uniform pitch.

17. A distributed feedback semiconductor laser according to claim 1, further comprising first current injection means for injecting current into a region including said first phase shift region and second current injection means for injecting current into a region lacking said first phase shift region.

18. A distributed feedback semiconductor laser according to claim 6, further comprising first current injection means for injecting current into a region including said first phase shift region and second current injection means for injecting current into a region including said second phase shift region.

19. A light source apparatus comprising:
 a polarization switchable distributed feedback semiconductor laser comprising:
  a waveguide including an active layer and a diffraction grating, said waveguide extending along a cavity-axial direction and being defined such that propagation of light in two different polarization modes is permitted in said waveguide;
  a plurality of electrodes arranged in series along said cavity-axial direction;
  a first phase shift region formed in a waveguide part of said waveguide located under one of said plurality of electrodes,
   wherein the waveguide part comprises said first phase shift region and a region other than said first phase shift region,
  said first phase shift region extending along the cavity-axial direction and having a polarization dependency that an effective refractive index for propagation light of said first phase shift region differs from an effective refractive index for propagation light of the other region such that a phase shift of a quarter wavelength of the propagation light is created for one of the two polarization modes and a phase shift of a half wavelength of the propagation light is created for the other of the two polarization modes in said first phase shift region; and
 a mode selector for selecting a component of a desired mode from a light output from said laser.

20. A light source apparatus according to claim 19, said mode selector being set such that the component in said one of the two polarization modes can be selected.

21. An optical transmitter comprising:
 a polarization switchable distributed feedback semiconductor laser comprising:
  a waveguide including an active layer and a diffraction grating, said waveguide extending along a cavity-axial direction and being defined such that propagation of light in two different polarization modes is permitted in said waveguide;
  a plurality of electrodes arranged in series along said cavity-axial direction;
  a first phase shift region formed in a waveguide part of said waveguide located under one of said plurality of electrodes,
   wherein the waveguide part comprises said first phase shift region and a region other than said first phase shift region,
  said first phase shift region extending along the cavity-axial direction and having a polarization dependency that an effective refractive index for propagation light of said first phase shift region differs from an effective refractive index for propagation light of the other region such that a phase shift of a quarter wavelength of the propagation light is created for one of the two polarization modes and a phase shift of a half wavelength of the propagation light is created for the other of the two polarization modes in said first phase shift region;
  control means for controlling a light output from said laser in accordance with a transmission signal; and
 a mode selector for selecting a component of a desired mode from the light output from said laser.

22. A light source apparatus according to claim 21, said mode selector being set such that the component in said one of the two polarization modes can be selected.

23. An optical communication system for communicating over a light transmission line that transmits a signal from a transmitter side to a receiver side, said system comprising:
 (a) an optical transmitter for transmitting light of a signal through the light transmission line comprising:
  a polarization switchable distributed feedback semiconductor laser comprising:
   a waveguide including an active layer and a diffraction grating, said waveguide extending along a cavity-axial direction and being defined such that propagation of light in two different polarization modes is permitted in said waveguide;
   a plurality of electrodes arranged in series along said cavity-axial direction;
   a first phase shift region formed in a waveguide part of said waveguide located under one of said plurality of electrodes,
    wherein the waveguide part comprises said first phase shift region and a region other than said first phase shift region,
   said first phase shift region extending along the cavity-axial direction and having a polarization dependency that an effective refractive index for propagation light of said first phase shift region differs from an effective refractive index for propagation light of the other region such that a phase shift of a quarter wavelength of the propagation light is created for one of the two polarization modes and a phase shift of a half wavelength of the propagation light is created for the other of the two polarization modes in said first phase shift region; and
   control means for controlling a light output from said laser in accordance with a transmission signal; and
   a mode selector for selecting a component of a desired mode from the light output from said laser; and
 (b) a receiver for receiving and detecting an intensity-modulated signal transmitted from said laser through the light transmission line.

24. An optical communication system according to claim 23, said mode selector being set such that the component in said one of the two polarization modes can be selected.

25. An optical communication system according to claim 23, said system being a wavelength division multiplexing optical communication system, in which the light transmission line transmits a plurality of intensity-modulated signals at a plurality of wavelengths generated by a plurality of said transmitters, and a wavelength selector selects the intensity-modulated signal at a desired wavelength to be detected on a side of said receiver.

* * * * *

UNITED STATES PATENT AND TRADEMARK OFFICE
CERTIFICATE OF CORRECTION

PATENT NO. : 6,411,640 B1
DATED : June 25, 2002
INVENTOR(S) : Nakanishi

It is certified that error appears in the above-identified patent and that said Letters Patent is hereby corrected as shown below:

Column 3,
Line 33, "β" should read -- α --.

Column 5,
Line 4, "above" should be deleted; and
Line 23, "c an" should read -- can --.

Column 6,
Line 20, "phase." should read -- phase --.

Column 14,
Line 54, "fifh" should read -- fifth --.

Column 17,
Line 21, "-a" should read -- a --.

Column 20,
Line 56, "region; and" should read -- region; --.

Signed and Sealed this

Seventeenth Day of December, 2002

JAMES E. ROGAN
*Director of the United States Patent and Trademark Office*